(12) United States Patent
Hangaishi

(10) Patent No.: US 6,777,984 B2
(45) Date of Patent: Aug. 17, 2004

(54) DIFFERENTIAL AMPLIFYING METHOD AND APPARATUS CAPABLE OF RESPONDING TO A WIDE INPUT VOLTAGE RANGE

(75) Inventor: Makoto Hangaishi, Osaka (JP)

(73) Assignee: Ricoh Company, LTD, Tokyo (JP)

( * ) Notice: Subject to any disclaimer, the term of this patent is extended or adjusted under 35 U.S.C. 154(b) by 0 days.

(21) Appl. No.: 10/251,102

(22) Filed: Sep. 20, 2002

(65) Prior Publication Data

US 2003/0076163 A1 Apr. 24, 2003

(30) Foreign Application Priority Data

Sep. 20, 2001 (JP) ........................................ 2001-287139

(51) Int. Cl.[7] ................................................ H03K 5/22
(52) U.S. Cl. ........................................ 327/66; 327/359
(58) Field of Search ............................ 327/63–67, 77, 327/89, 356, 359

(56) References Cited

U.S. PATENT DOCUMENTS

| | | | |
|---|---|---|---|
| 5,726,592 A | * 3/1998 | Schulte et al. | 327/65 |
| 5,764,086 A | * 6/1998 | Nagamatsu et al. | 327/65 |
| 6,160,424 A | * 12/2000 | Migliavacca | 327/65 |
| 6,252,435 B1 | * 6/2001 | Wu et al. | 327/65 |
| 6,445,218 B1 | * 9/2002 | Lee | 327/65 |

FOREIGN PATENT DOCUMENTS

| | | |
|---|---|---|
| EP | 1100168 | 5/2001 |
| JP | 476246 | 12/1992 |
| JP | 8204470 | 8/1996 |
| JP | 993055 | 4/1997 |
| WO | WO9309456 | 8/1993 |

* cited by examiner

Primary Examiner—Kenneth B. Wells
(74) Attorney, Agent, or Firm—Cooper & Dunham LLP

(57) ABSTRACT

A differential amplifying apparatus includes first and second differential pair circuits having opposite conductivity, first and second current sources, first and second current mirror circuits, and a first voltage amplifying circuit. The first current source is connected between the first differential pair circuit and a first power source terminal, biasing the first differential pair circuit. The second current source is connected between the second differential pair circuit and a second power source terminal, biasing the second differential pair circuit. The first current mirror circuit is connected between a corresponding output terminal of the second differential pair circuit and the first power source terminal. The second current mirror circuit is connected between a corresponding output terminal of the second differential pair circuit and the first power source terminal. The first voltage amplifying circuit amplifies voltages from the first differential pair circuit and outputs amplified voltages.

44 Claims, 17 Drawing Sheets

DIFFERENTIAL AMPLIFYING METHOD AND APPARATUS CAPABLE OF RESPONDING TO A WIDE INPUT VOLTAGE RANGE

BACKGROUND

1. Field of the Invention

The present patent specification relates to a method and apparatus for differential voltage amplifying, and more particularly to a method and apparatus for differential voltage amplifying capable of responding to a wide range of input voltage and achieving a high gain.

2. Discussion of Background

Conventionally, background differential amplifying circuits are provided with two oppositely-conductive differential transistor pairs so as to normally operate when receiving input voltages that vary within a power source voltage range. For example, Japanese Laid-Open Patent Publications, No. 04-076246 (1992), No. 08-204470 (1996), and No. 09-093055 (1997) discuss the above-mentioned background differential amplifying circuits.

FIG. 1 illustrates a background differential amplifying circuit 100 discussed in by Japanese Laid-Open Patent Publication, No. 04-076246 (1992). In FIG. 1, the background differential amplifying circuit 100 includes first and second power source terminals V1 and V2, first and second input terminals In1 and In2, first and second differential pair circuits 101 and 102, a first current source 103 for supplying a current to the first differential pair circuit 101, a second current source 104 for supplying a current to the second differential pair circuit 102, first and second current mirror circuits 105 and 106 both connected to the first and second differential pair circuits 101 and 102, and a load circuit 107.

In FIG. 1, the first differential pair circuit 101 is connected to the first and second input terminals In1 and In2 and to the first and second output terminals OUT1 and OUT2, and is biased by the first current source 103. The second differential pair circuit 102 is connected to the first and second input terminals In1 and In2 and is biased by the second current source 104. The first current mirror circuit 105 is connected to the first power source terminal V1, the second output terminal OUT2, and one output terminal of the second differential pair circuit 102. The current mirror circuit 106 is connected to the first power source terminal V1, the first output terminal OUT1, and the other output terminal of the second differential pair circuit 102.

FIG. 2 illustrates a detailed circuit of the background differential amplifying circuit 100, using CMOS (complementary metal oxide semiconductor) transistors. In FIG. 2, the first power source terminal V1 is fed with a negative power source voltage VSS and the second power source terminal V2 is fed with a positive power source voltage VDD.

The background differential amplifying circuit 100 operates to achieve approximately 46 dB with the input voltages at a middle level in the range of the power source voltage in which the first and second differential pair circuits 101 and 102 can be both operable and, with other input voltages, approximately 40 dB by one of the two differential pair circuits 101 and 102.

Generally, a differential amplifying circuit having a negative feedback circuit produces a relatively large output error, which is an error against an expected value of an output voltage when the circuit generates a relatively small gain, without considering an offset voltage inherently provided to the differential amplifying circuit. Moreover, when the differential amplifying circuit uses oppositely-conductive differential pair circuits to allow the operations in an expanded input voltage range, it produces relatively large variations in the output voltages in response to changes in the input voltages.

Therefore, the background differential amplifying circuit 100 of Japanese Laid-Open Patent Publication, No. 04-076246 (1992) may use an output circuit having a maximum gain of approximately 30 dB, thereby increasing a total gain.

In this way, it is possible to increase the gain by adding an output circuit. However, the gain generally depends on the input voltage. For example, the gain with the input voltages at a middle level in the range of the power source voltage is greatly different from that with the input voltages close to the power source voltage. With the different gains, the output errors become different typically in the case where negative feedback is applied. In particular, with the input voltages close to the power source voltage, only one of the two differential pair circuits operates and the gain of the output circuit is reduced to nearly 0 dB. Therefore, the output error may be greater.

An operational amplifier using a differential amplifying circuit commonly uses a negative feedback circuit. FIG. 3 illustrates a background non-inverse amplifier using an operational amplifier including the background differential amplifying circuit 100, for example. In the circuit of FIG. 3, when various variables are defined as an input voltage X2, an input voltage X1, an output voltage Y, resisters R1 and R2, the input voltage X2 and the output voltage Y can be expressed respectively by the following equations;

$$X2=\{R1/(R1+R2)\}*Y,$$

and $$Y=K*(X1-X2+\Delta V),$$

wherein K represents an open loop gain and $\Delta V$ represents an offset voltage, both inherent to a differential amplifying circuit. When $\Delta V$ in the second equation is disregarded, the second equation is modified as follows;

$$Y=K*(X1-X2).$$

Based on the first and the third equations, the output voltage Y is expressed by the following fourth equation;

$$Y=X1/\{R1/(R1+R2)+(1/K)\}.$$

From the fourth equation, it is understood that the gain of the differential amplifying circuit affects the error of the output voltage relative to the input voltage and also that the output error is varied by the ratio of resisters and the amplitude of input voltage. In other words, the output error becomes relatively greater when the differential amplifying circuit has a relatively small gain or when the gain of the negative feedback circuit by resister is relatively large.

Japanese Laid-Open Patent Publication, No. 04-076246 further discusses an exemplary use of the above-described differential amplifying circuit 100 of FIGS. 1 and 2 in the form of a voltage follower in an A/D (analog-to-digital) converter. The differential amplifying circuit 100 forms a voltage follower and is placed as a front stage to an A/D converter. In the above fourth equation, the resister R1 is substantially infinity and the resister R2 is substantially 0.

Therefore, the output voltage Y has the error of the input voltage X1 multiplied by K/(K+1). This indicates that the output error changes with a change of the input voltage X1, as in the case in which the non-inverse amplifying circuit is formed.

Japanese Laid-Open Patent Publication, No. 04-076246, indicates that the differential amplifying circuit forming a voltage follower produces variations in a range of from approximately 40 dB to approximately 70 dB. With variations of 40 dB, an output error of 1% relative to the input voltage is produced. This means that when the A/D converter and the differential amplifying circuit have the power source voltage, the A/D converter that operates for 10 bits has an error equivalent to a value ten times of the least significant bit.

For another example, there are some cases in which input voltages are amplified in order to accurately convert the input voltages with an A/D converter when the input voltages have relatively small amplitude. For example, when the non-inverse amplifying circuit of FIG. 3, using the background amplifying circuit 100, is provided as a front stage to an A/D converter, the input voltages have output errors, as explained with reference to FIG. 3. Also, the non-inverse amplifying circuit receives an adverse effect by the gain of the negative feedback circuit by the resisters in comparison with the case of the voltage follower. Accordingly, when the gain of the negative feedback circuit is relatively large, the output errors further increase.

As described above, when the differential amplifying circuit having a relatively small gain is used as the input circuit for the A/D converter, it produces errors of the input voltage input to the A/D converter and, as a result, the A/D converter degrades its accuracy in the A/D conversion.

SUMMARY

This patent specification describes a novel differential amplifying apparatus which has first and second input terminals for receiving input voltages and first and second output terminals for outputting output voltages. In one example, a novel differential amplifying apparatus includes first and second differential pair circuits, first and second current sources, a load circuit, first and second current mirror circuits, and a first voltage amplifying circuit. The first differential pair circuit includes a pair of transistors having corresponding control electrodes connected to the first and second input terminals. The second differential pair circuit includes a pair of transistors having corresponding control electrodes connected to the first and second input terminals, and possesses conductivity with a polarity opposite from the first differential pair circuit. The first current source is connected between the first differential pair circuit and a first power source terminal and is configured to bias the first differential pair circuit. The second current source is connected between the second differential pair circuit and a second power source terminal and is configured to bias the second differential pair circuit. The load circuit is connected between the first differential pair circuit and the second power source terminal, and is configured to load the first differential pair circuit. The first current mirror circuit is connected between a corresponding output terminal of the second differential pair circuit and the first power source terminal and has an output terminal connected to the second output terminal. The second current mirror circuit is connected between a corresponding output terminal of the second differential pair circuit and the first power source terminal and has an output terminal connected to the first output terminal. The first voltage amplifying circuit is configured to amplify voltages output from output terminals of the first differential pair circuit and to output amplified voltages to the first and second output terminals.

Each of the first and second current mirror circuits may include a pair of transistors connected in a cascade connection.

The first voltage amplifying circuit may include a pair of transistors having control electrodes to which a first predetermined constant voltage is applied, amplifying voltages output from corresponding output terminals of the first differential pair circuit, and outputting amplified voltages.

The above-mentioned differential amplifying apparatus may further include a second voltage amplifying circuit configured to amplify voltages output from the first and second current mirror circuits and to output amplified voltages to the corresponding first and second output terminals.

The second voltage amplifying circuit may include a pair of transistors having control electrodes to which a second predetermined constant voltage is applied, amplifying voltages output from corresponding of the first and second current mirror circuits, and outputting amplified voltages.

The above-mentioned differential amplifying apparatus may further include a current supply circuit connected between the output terminals of the first voltage amplifying circuit and the first power source terminal and configured to bypass currents output from the respective output terminals of the first voltage amplifying circuit to the first power source terminal so as to supply currents to the first voltage amplifying circuit.

The current supply circuit may include a pair of transistors having control electrodes to which a third predetermined constant voltage is applied and bypassing the corresponding currents output from of the first voltage amplifying circuit to the first power source terminal.

The above-mentioned differential amplifying apparatus may further include a current supply circuit having input terminals connected to corresponding of the output terminals of the first voltage amplifying circuit and output terminals connected to input terminals of corresponding of the first and second current mirror circuits and configured to supply currents to the first voltage amplifying circuit when the second differential pair circuit stops its operation by bypassing the currents output from the respective output terminals of the first voltage amplifying circuit to the first power source terminals via corresponding of the first and second current mirror circuits.

The current supply circuit may include a pair of transistors having control electrodes to which a fourth predetermined constant voltage is applied, and connected between the output terminals of the first voltage amplifying circuit and the input terminals of corresponding of the first and second current mirror circuits.

The fourth predetermined voltage may be a voltage to turn on the transistors of the current supply circuit when the second differential pair circuit stops its operation.

The above-mentioned differential amplifying apparatus may further include an output circuit for amplifying the voltages output from the first and second output terminals.

This patent specification further describes a novel differential amplifying method of amplifying voltages input from first and second input terminals and outputting from first and second output terminals. In one example, this novel differential amplifying method includes the following providing and connecting steps. The providing step provides a first differential pair circuit including a pair of transistors having corresponding control electrodes. The connecting step connects control electrodes of the pair of transistors to corresponding of the first and second input terminals. The providing step provides a second differential pair circuit including a pair of transistors having conductivity with a polarity opposite from conductivity of the pair of transistors of the first differential pair circuit. The connecting step connects control electrodes of the pair of transistors to corresponding of the first and second input terminals. The connecting step connects a first current source between the first differential pair circuit and a first power source terminal to bias the first differential pair circuit. The connecting step connects a second current source between the second differential pair circuit and a second power source terminal to bias the second differential pair circuit. The connecting step connects a load circuit between the first differential pair circuit and the second power source terminal to load the first differential pair circuit. The connecting step connects a first current mirror circuit between a corresponding output terminal of the second differential pair circuit and the first power source terminal. The connecting step connects an output terminal of the first current mirror circuit to the second output terminal. The connecting step connects a second current mirror circuit between a corresponding output terminal of the second differential pair circuit and the first power source terminal. The connecting step connects an output terminal of the second current mirror circuit to the first output terminal. The connecting step connects a first voltage amplifying circuit between output terminals of the first differential pair circuit and corresponding of the first and second output terminals. The first voltage amplifying circuit amplifies the voltages output from the output terminals of the first differential pair circuit and outputs amplified voltages to the corresponding of the first and second output terminals.

Each of the first and second current mirror circuits may include transistors connected in a cascade connection.

The first voltage amplifying circuit may include a pair of transistors having control electrodes to which a first predetermined constant voltage is applied, amplifying voltages output from corresponding output terminals of the first differential pair circuit, and outputting amplified voltages.

The above-mentioned method may further include the step of connecting a second voltage amplifying circuit between the output terminals of the first and second current mirror circuits and the corresponding first and second output terminals. The second voltage amplifies circuit amplifying voltages output from the first and second current mirror circuits and outputs amplified voltages to the corresponding first and second output terminals.

The second voltage amplifying circuit may include a pair of transistors having control electrodes to which a second predetermined constant voltage is applied, amplifying voltages output from corresponding of the first and second current mirror circuits, and outputting amplified voltages.

The above-mentioned method may further include the step of connecting a current supply circuit between the output terminals of the first voltage amplifying circuit and the first power source terminal. The current supply circuit is configured to bypass currents output from the respective output terminals of the first voltage amplifying circuit to the first power source terminal so as to supply currents to the first voltage amplifying circuit.

The current supply circuit may include a pair of transistors having control electrodes to which a third predetermined constant voltage is applied and bypassing the corresponding currents output from of the first voltage amplifying circuit to the first power source terminal.

The above-mentioned method may further includes the following steps. The providing step provides a current supply circuit. The connecting step connects input terminals of the current supply circuit to corresponding of the output terminals of the first voltage amplifying circuit. The connecting step connects output terminals of the current supply circuit to input terminals of corresponding of the first and second current mirror circuits. In this method, the current supply circuit supplies currents to the first voltage amplifying circuit when the second differential pair circuit stops its operation by bypassing the currents output from the respective output terminals of the first voltage amplifying circuit to the first power source terminals via corresponding of the first and second current mirror circuits.

The current supply circuit may include a pair of transistors having control electrodes to which a fourth predetermined constant voltage is applied, and connected between the output terminals of the first voltage amplifying circuit and the input terminals of corresponding of the first and second current mirror circuits.

The fourth predetermined voltage may be a voltage to turn on the transistors of the current supply circuit when the second differential pair circuit stops its operation.

The above-mentioned method may further include the step of providing an output circuit for amplifying the voltages output from the first and second output terminals.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
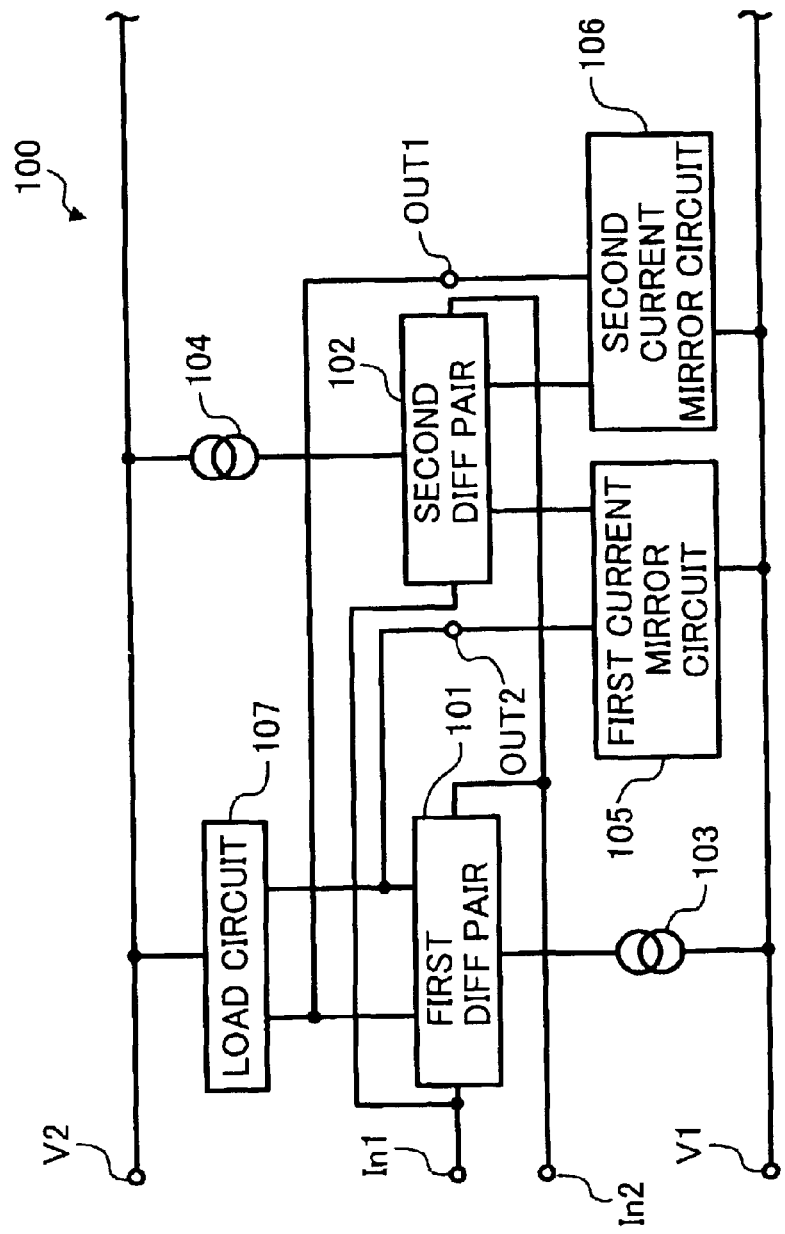
FIG. 1 is a schematic block diagram of a background differential amplifying circuit.
Figure 2:
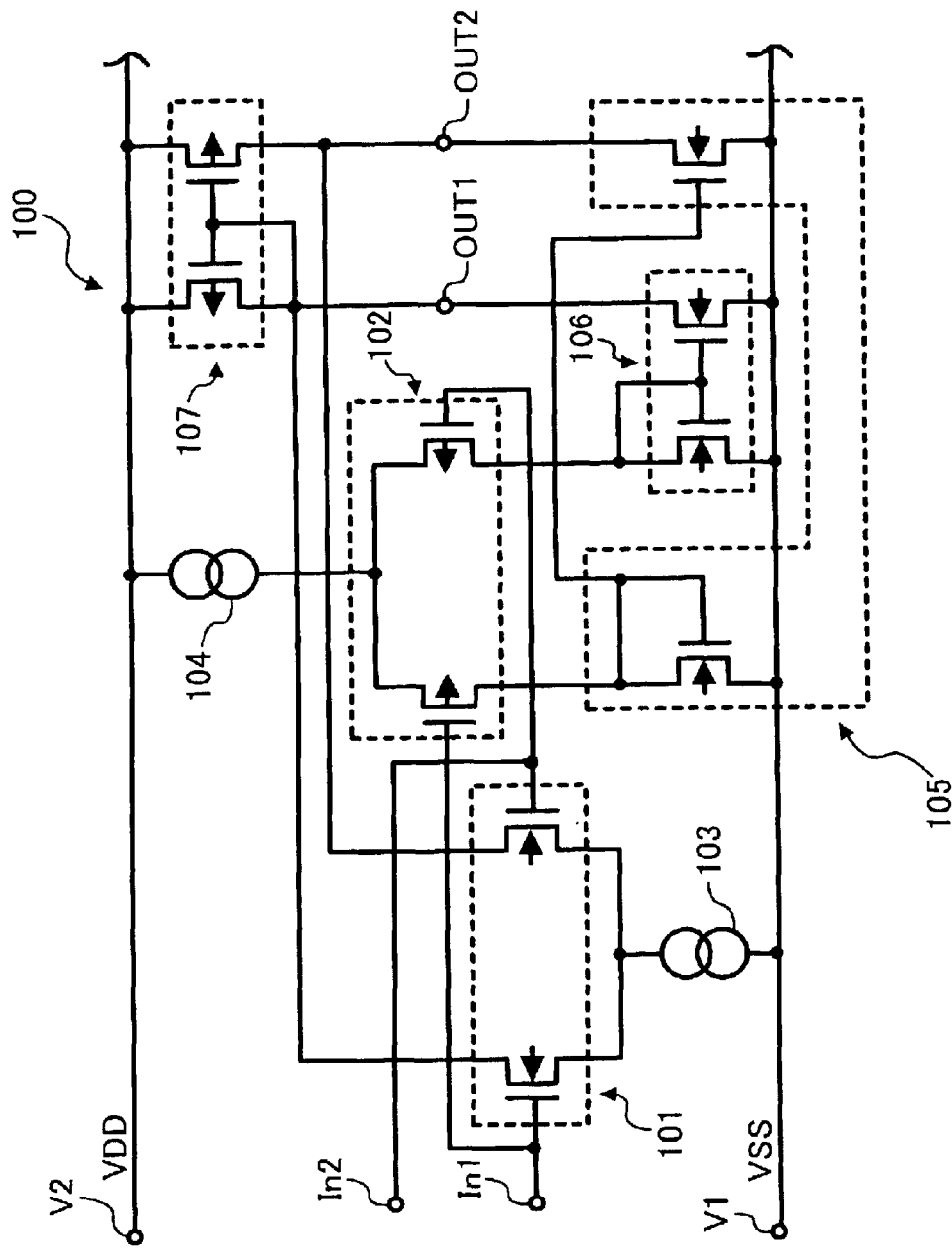
FIG. 2 is a circuit diagram for explaining the details of the background differential amplifying circuit of FIG. 1.
Figure 3:
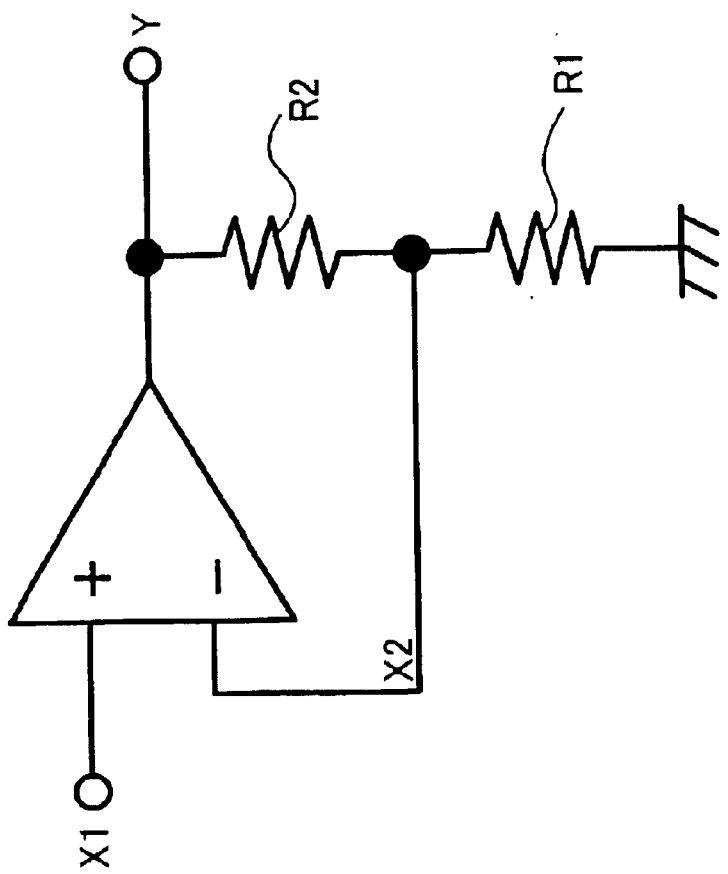
FIG. 3 is a non-inverse amplifier formed with an operational amplifier composed of the background differential amplifying circuit of FIG. 1.
Figure 4:
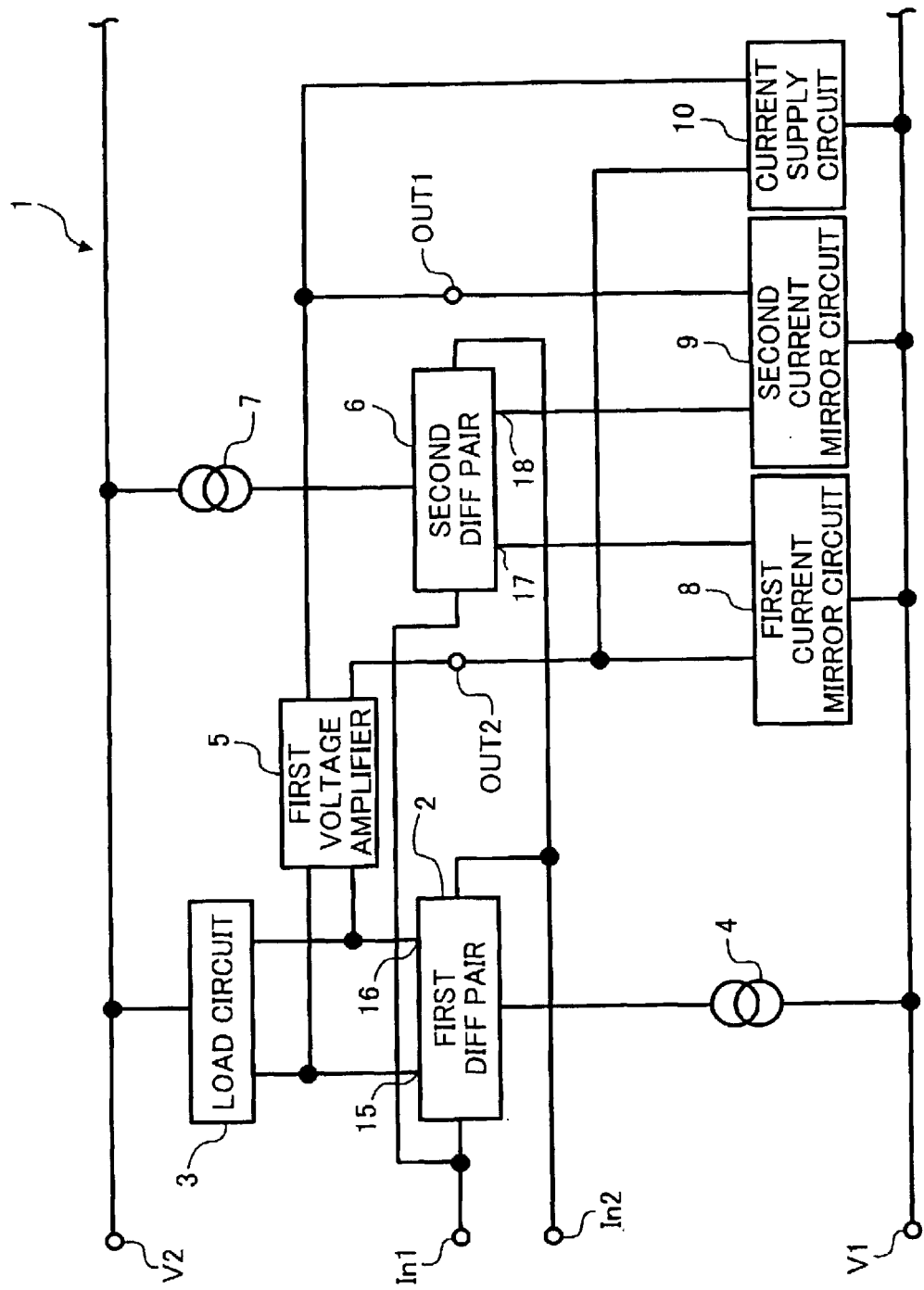
FIG. 4 is a schematic block diagram of a differential amplifying circuit according to a preferred embodiment.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIG. 4, a differential amplifying circuit 1 according to a preferred exemplary embodiment is explained. FIG. 4 shows the differential amplifying circuit 1 which includes a first differential pair circuit 2, a load circuit 3, and a first current source 4. The first differential pair circuit 2 is connected to first and second input terminals In1 and In2, the load circuit 3, and the first current source 4. The load circuit 3 serves as a load to the first differential pair circuit 2. The first current source 4 supplies a current to the first differential pair circuit 2 and the load circuit 3.

The differential amplifying circuit 1 further includes a first voltage amplifier 5, a second differential pair circuit 6, and a second current source 7. The first voltage amplifier 5 amplifies voltages output from output terminals 15 and 16 of the first differential pair circuit 2 and outputs the amplified voltage to first and second output terminals OUT1 and OUT2, respectively, of the differential amplifying circuit 1. The second differential pair circuit 6 is connected to the input terminals In1 and In2 and the second current source 7 which supplies a current to the second differential pair circuit 6. The second differential pair circuit 6 forms a reverse conductive differential pair circuit.

The differential amplifying circuit 1 further includes first and second current mirror circuits 8 and 9 and a current supply circuit 10. The first current mirror circuit 8 has an output terminal connected to the second output terminal OUT2 of the differential amplifying circuit 1 and an input terminal connected to an output terminal 17 of the second differential pair circuit 6. The second current mirror circuit 9 has an output terminal connected to the first output terminal OUT1 of the differential amplifying circuit 1 and an input terminal connected to an output terminal 18 of the second differential pair circuit 6. The current supply circuit 10 supplies a current to the first voltage amplifier 5 such that the first voltage amplifier 5 is correctly operative when the second differential pair circuit 6 stops its operation.

The load circuit 3, the first differential pair circuit 2, and the first current source 4 are connected in series between first and second power source terminals V1 and V2. The first differential pair circuit 2 is biased by the first current source 4. The load circuit 3 has two input terminals connected to respective of the output terminals 15 and 16 of the first differential pair circuit 2. The output terminals 15 and 16 of the first differential pair circuit 2 are connected to the corresponding input terminals of the first voltage amplifier 5. The output terminals of the first voltage amplifier 5 are connected to the corresponding first and second output terminals OUT1 and OUT2 of the differential amplifying circuit 1.

The second differential pair circuit 6 is biased by the second current source 7 connected to the second power source terminal V2. The first current mirror circuit 8 is connected between the output terminal 17 of the second differential pair circuit 6 and the first power source terminal V1. The second current mirror circuit 9 is connected between the output terminal of the second differential pair circuit 6 and the first power source terminal V1. The output terminal of the first current mirror circuit 8 is connected to the second output terminal OUT2 and the output terminal of the second current mirror circuit 9 is connected to the first output terminal OUT1. The current supply circuit 10 is connected between the first and second output terminals OUT1 and OUT2 and the first power source terminal V1.

Figure 5:
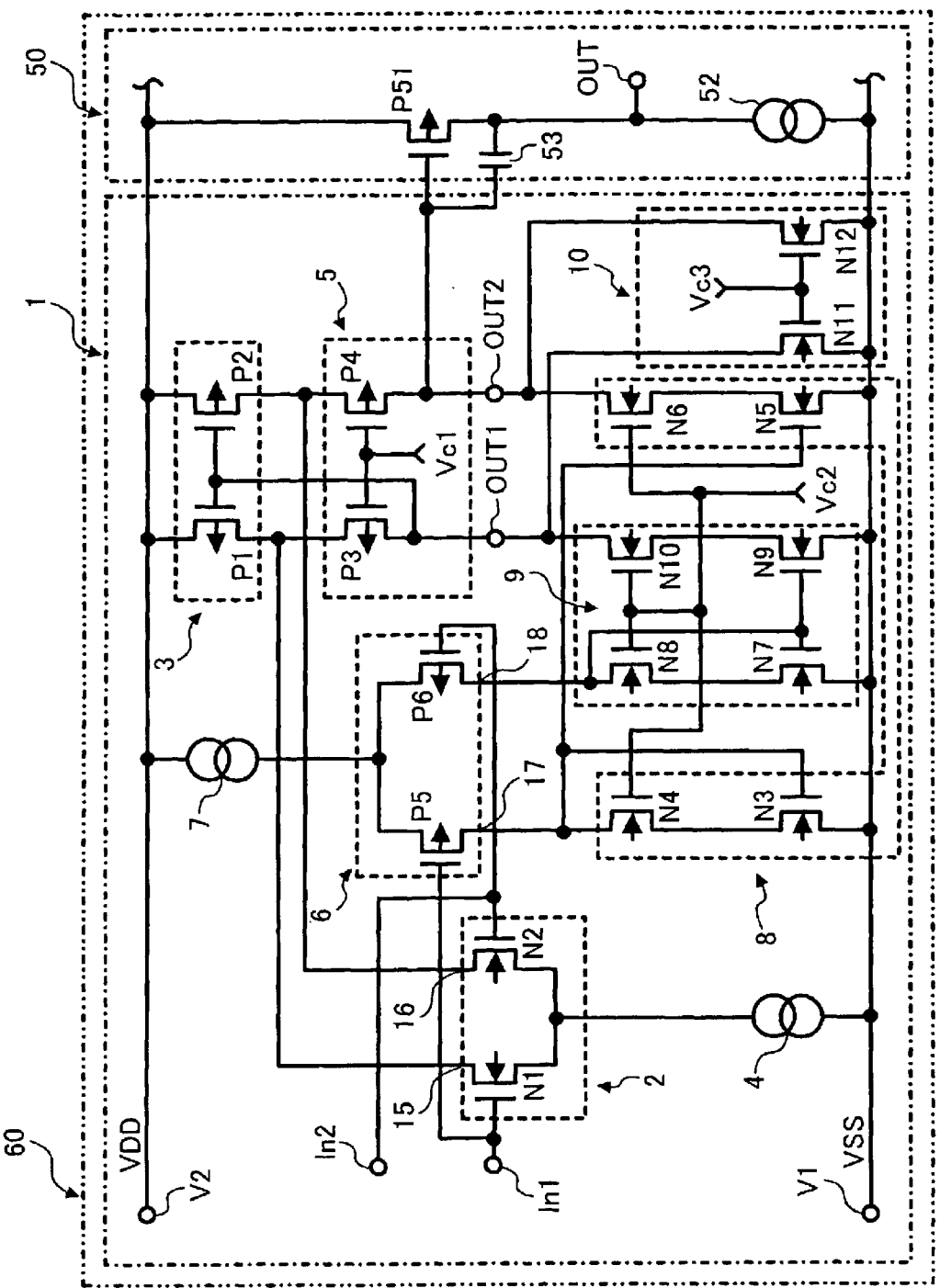
FIG. 5 is a detailed circuit diagram of an operational amplifier including the differential amplifying circuit of FIG. 4.

FIG. 5 shows an exemplary operational amplifier 60 that includes an output circuit 50 and the differential amplifying circuit 1 implemented in CMOS (complementary metal oxide semiconductor) integrated circuits. Each CMOS has a gate serving as a control electrode, a source terminal serving as an input terminal, and a drain terminal serving as an output terminal. In FIG. 5, the first power source terminal V1 is at a negative power source voltage VSS and the second power source terminal V2 is at a positive power source voltage VDD. The first differential pair circuit 2 includes a pair of N-channel MOS (metal oxide semiconductor) transistors (hereinafter referred to as an NMOS transistor) N1 and N2. The NMOS transistor N1 has a gate connected to the first input terminal In1 and the NMOS transistor N2 has a gate connected to the second input terminal In2. The NMOS transistors N1 and N2 have source terminals connected to each other, and this connected point is further connected to the first power source terminal V1 through the first current source 4. The output terminal 15 of the NMOS transistor N1 is a drain terminal and the output terminal 16 of the NMOS transistor N2 is a drain terminal.

The load circuit 3 includes P-channel MOS (metal oxide semiconductor) transistors (hereinafter referred to as a PMOS transistor) P1 and P2. The PMOS transistors P1 and P2 have gates connected to each other, and this connected point is further connected to the first output terminal OUT1. Each of the PMOS transistors P1 and P2 has a source terminal connected to the second power source terminal V2.

The PMOS transistor P1 has a drain terminal connected to the drain terminal of the NMOS transistor N1 and the PMOS transistor P2 has a drain terminal connected to the drain terminal of the NMOS transistor N2.

The first voltage amplifier 5 includes PMOS transistors P3 and P4. The PMOS transistors P3 and P4 have gates connected to each other, and this connected point is at a predetermined voltage Vc1, so that the PMOS transistors P3 and P4 are operative in a saturation region. The PMOS transistor P3 is connected between the output terminal 15 and the first output terminal OUT1, and the PMOS transistor P4 is connected between the output terminal 16 and the second output terminal OUT2.

The second differential pair circuit 6 includes a pair of PMOS transistors P5 and P6. The PMOS transistor P5 has a gate connected to the first input terminal In1, and the PMOS transistor P6 has a gate connected to the second input terminal In2. The PMOS transistors P5 and P6 have source terminals connected to each other, and this connected point is connected to the second power source terminal V2 though the second current source 7. The output terminal 17 of the PMOS transistor P5 is a drain terminal, and the output terminal 18 of the PMOS transistor P6 is a drain terminal.

The first current mirror circuit 8 includes NMOS transistors N3–N6. The NMOS transistors N3 and N4 are connected in a cascade connection, and the NMOS transistors N5 and N6 are connected in a cascade connection. The series circuit of the NMOS transistors N3 and N4 is connected between the output terminal 17 and the first power source terminal V1. The series circuit of the NMOS transistors N5 and N6 is connected between the second output terminal OUT2 and the first power source terminal V1. The NMOS transistors N3 and N5 have gates connected to each other, and this connected point is further connected to the output terminal 17. The NMOS transistors N4 and N6 have gates connected to each other, and this connected point is at a predetermined voltage Vc2, so that the NMOS transistors are operative in a saturation region.

The second current mirror circuit 9 includes NMOS transistors N7–N10. The NMOS transistors N7 and N8 are cascaded, and the NMOS transistors N9 and N10 are cascaded. The series circuit of the NMOS transistors N7 and N8 is connected between the output terminal 18 and the first power source terminal V1. The series circuit of the NMOS transistors N9 and N10 is connected between the first output terminal OUT1 and the first power source terminal V1. The NMOS transistors N7 and N9 have gates connected to each other, and this connected point is further connected to the output terminal 18. The NMOS transistors N8 and N10 have gates connected to each other, and this connected point is at the predetermined voltage Vc2, so that the NMOS transistors are operative in a saturation region.

The current supply circuit 10 includes NMOS transistors N11 and N12. The NMOS transistor N11 is connected between the first output terminal OUT1 and the first power source terminal V1, and the NMOS transistor N12 is connected between the second output terminal OUT2 and the first power source terminal V2. The NMOS transistors N11 and N12 have gates connected to each other, and this connection point is at a predetermined voltage Vc3.

The output circuit 50 includes a PMOS transistor P51, a constant current source 52, and a capacitor 53. A series circuit of the PMOS transistor P51 and the constant current source 52 is connected between the second power source terminal V2 and the first power source terminal V1. The PMOS transistor P51 has a gate connected to the second output terminal OUT2. The capacitor 53 is connected between the gate and a drain terminal of the PMOS transistor P51. A connection point between the PMOS transistor P51 and the constant current source 52 constitutes an output terminal OUT of the operational amplifier 60.

In this way, the differential amplifying circuit 1 has the polarity-opposite first and second differential pair circuits 2 and 6, which receive electric power from the first and second power source terminals V1 and V2 and are connected to the first and second input terminals In1 and In2. The output signal from the first differential pair circuit 2 is voltage-amplified by the first voltage amplifier 5 and is then amplified by being combined with the output signal from the second differential pair circuit 6 by the first and second mirror circuits 8 and 9. The respective combined signals are then output from the first and second output terminals OUT1 and OUT2.

As described above, the present embodiment shown in FIG. 5 has an exemplary structure in which the first power source terminal V1 is at the negative power source voltage VSS and the second power source terminal V2 is at the positive power source voltage VDD. In this structure, the first differential pair circuit 2 is configured with NMOS transistors and the second differential pair circuit 6 is configured with PMOS transistors so that the first and second differential pair circuits 2 and 6 have opposite polarities. With opposite polarities, at least one of the first and second differential pair circuits 2 and 6 is operative even when the first and second input terminals In1 and In2 receive respective input voltages close to the positive power source voltage VDD or the negative power source voltage VSS. Therefore, voltages near the power source voltage can be input to the input terminals In1 and In2, and the first and second differential pair circuits 2 and 6 are operable when the input voltages are at an intermediate level in the range of the given power source voltages.

The respective signals output from the output terminals 15 and 16 of the first differential pair circuit 2, the gain stage, are amplified by the PMOS transistors P3 and P4 that have the predetermined voltage Vc1 to their gates, and are output to the first and second output terminals OUT1 and OUT2, respectively. The respective signals output from the output terminals 17 and 18 of the second differential pair circuit 6, the gain stage, are amplified by the cascaded NMOS transistors N3 and N4 and the cascaded NMOS transistors N7 and N8, respectively.

The respective signals amplified are further amplified by the cascaded NMOS transistors N5 and N6 and the cascaded NMOS transistors N9 and N10, respectively, and are output from the second output terminal OUT2 and the first output terminal OUT1, respectively.

In this example, the first and second current mirror circuits 8 and 9 connected to the second differential pair circuit 6 are capable of correctly performing the current mirror operations by having the cascaded pair transistors in the input and output stages thereof.

Also, the differential amplifying circuit 1 can produce a desired gain even when a voltage close to the power source voltage is input thereto and makes one of the first and second differential pair circuits 2 and 6 operative.

When voltages close to the negative power source voltage VSS are input to the first and second input terminals In1 and In2, the first differential pair circuit 2 composed of the NMOS transistors may stop its operation and consequently no current may flow through the output terminals 15 and 16. Accordingly, the voltages at the output terminals 15 and 16 may become close to the positive power source voltage VDD. On the other hand, when voltages close to the negative power source voltage VSS are input to the first and second input terminals In1 and In2, the second differential pair circuit 6 composed of the PMOS transistors normally operates. Accordingly, the currents output from the output terminals 17 and 18 are processed through the first and second current mirror circuits 8 and 9, respectively, and are output from the second output terminals OUT2 and the first current mirror circuit OUT1, respectively.

On the contrary, when voltages close to the positive power source voltage VDD are input to the first and second input terminals In1 and In2, the first differential pair circuit 2 composed of the NMOS transistors normally operates. In this case, however, the second differential pair circuit 6 composed of the PMOS transistors may stop its operation, and the output voltages at the output terminals 17 and 18 may become close to the negative power source voltage VSS. Since the first and second current mirror circuits 8 and 9 determine their output current values by the voltages at the output terminals 17 and 18, respectively, the currents may hardly flow with the voltages close to the negative power source voltage VSS at the output terminals 17 and 18. As a consequence, expected effects by the arrangements of the NMOS transistors N6 and N10 and the PMOS transistors P3 and P4 may not be produced. This may cause a failure in which the respective voltages output from the first and second output terminals 15 and 16 of the first differential pair circuit 2 are not transmitted to the first and second output terminals OUT1 and OUT2, respectively.

To avoid the above failure, the current supply circuit 10 provides alternative current passages. That is, the NMOS transistors N11 and N12 of the current supply circuit 10 form respective current passages in place of the first and second current mirror circuits 8 and 9. The NMOS transistors N11 and N12 allow the currents to flow through the PMOS transistors P3 and P4 of the first voltage amplifier 5 in accordance with the predetermined voltage Vc3 applied to the gates of the NMOS transistors N11 and N12.

With the above-mentioned function of the current supply circuit 10, currents flow through the PMOS transistors P3 and P4 and therefore the PMOS transistors P3 and P4 operate even when the second differential pair circuit 6 composed of the PMOS transistors stops its operation and no current flows through the NMOS transistors N5 and N9 if voltages close to the positive power source voltage VDD are input to the first and second input terminals In1 and In2. As a consequence, high gain signals can be output from the first and second output terminals OUT1 and OUT2.

The output circuit 50 is an output stage composed of a simple amplifying circuit. Since the differential amplifying circuit 1 is capable of producing high gain signals as described above, the output circuit 50 itself is not required to have a complicated structure to produce high gains and can consequently output a desired gain relative to the input voltages within the range of the power source voltage.

Figure 6:
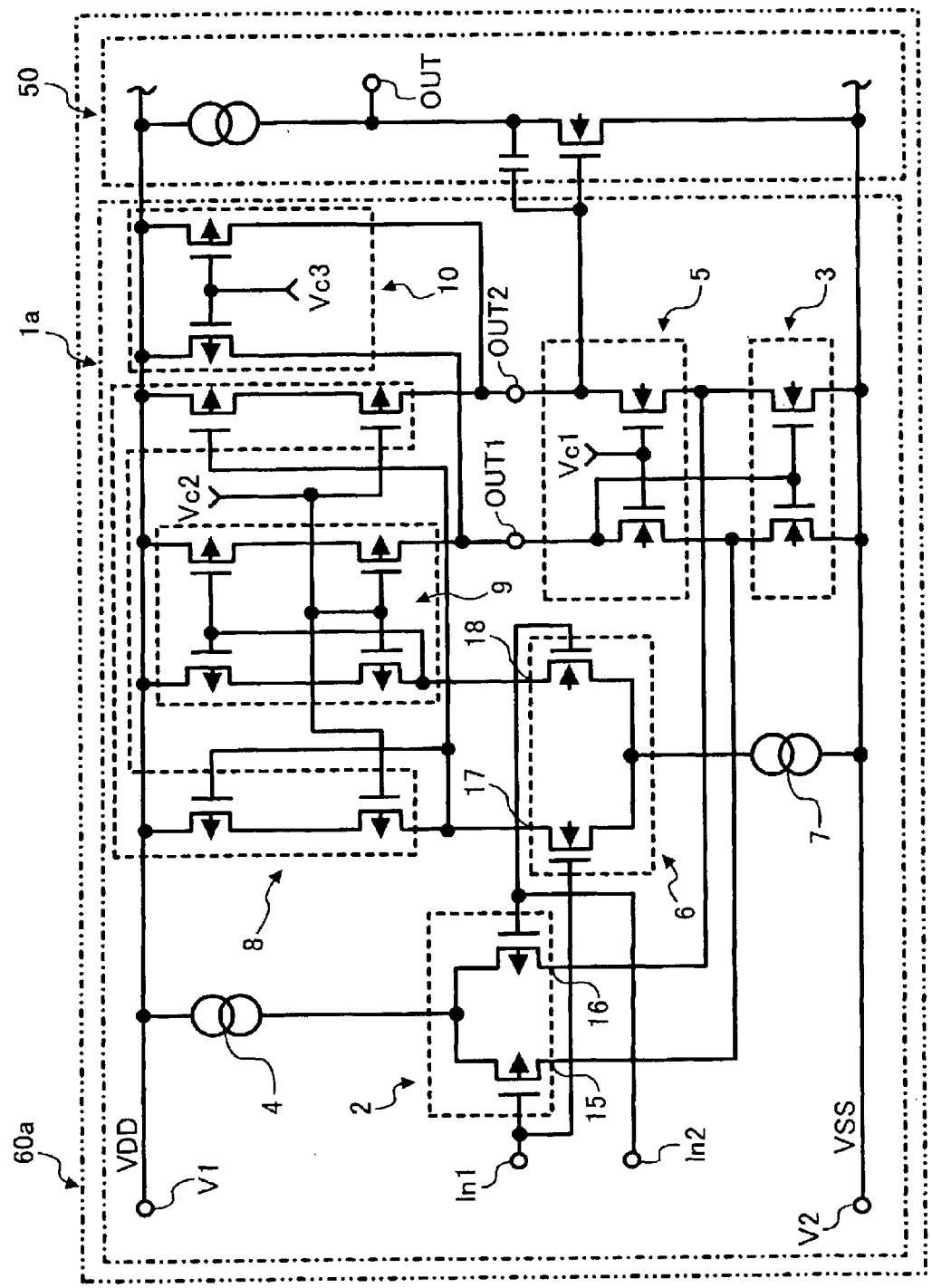
FIG. 6 is a detailed circuit diagram of a modified operational amplifier including a modified differential amplifying circuit based on the differential amplifying circuit of FIG. 5.

FIG. 6 shows a modified operational amplifier 60a that includes a modified differential amplifying circuit 1a and the output circuit 50. The modified differential amplifying circuit 1a is based on the differential amplifying circuit 1 of FIG. 5. In the modified differential amplifying circuit 1a, the first power source terminal V1 is at the positive power voltage VDD, instead of the negative power voltage VSS, the second power source terminal V2 is at the negative power voltage VSS, instead of the positive power voltage VDD, and the corresponding transistors are replaced with those having opposite polarities. The modified differential amplifying circuit 1a of FIG. 6 is also capable of producing high gain signals as the differential amplifying circuit 1 of FIG. 5 produces.

Figure 7:
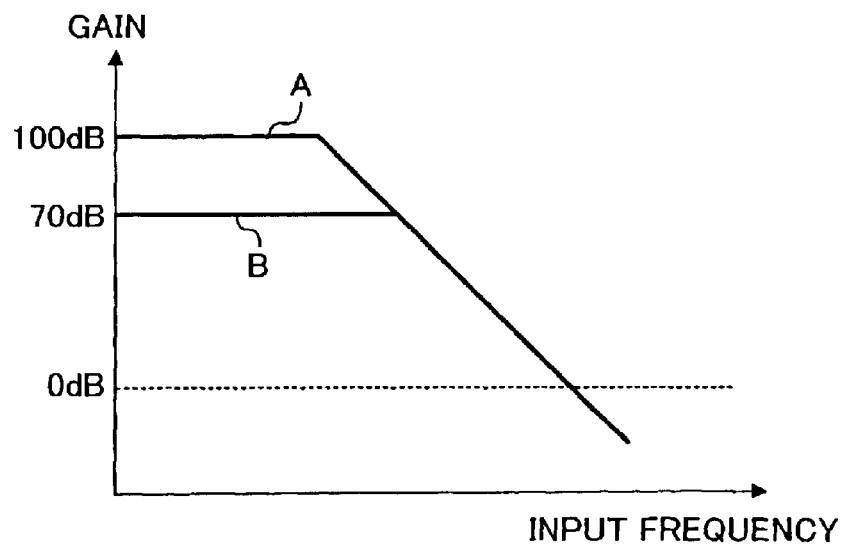
FIG. 7 is a graph for explaining gains achieved by the operational amplifiers shown in FIGS. 5 and 6 in comparison with a gain achieved by a background operational amplifier including the background differential amplifying circuit of FIG. 2.

In the above-described differential amplifying circuits 1 and 1a, the gain relative to the input voltages can be maximized when the input voltages are intermediate the power source voltages at which the two differential pair circuits 2 and 6 are fully operable. The above-described differential amplifying circuits 1 and 1a have a gain of approximately 70 dB relative to the input voltages at a middle level in the given power source voltage range applied to the first and second input terminals In1 and In2. If one of these differential amplifying circuits 1 and 1a is connected to, for example, an output circuit discussed in Japanese Laid-Open Patent Publication No. 04-076246 (1992) having a gain of from 0 dB to 30 dB relative to the input voltages at a middle level in the given power source voltage, the circuit as a whole can achieve a gain of approximately 100 dB relative to the input voltages at a middle level in the power source voltage range, as illustrated in FIG. 7. In FIG. 7, a letter A indicates the case when the differential amplifying circuit 1 or 1a is used and, as a comparison, a letter B indicates the case of using the background differential amplifying circuit 100 described in Japanese Laid-Open Patent Publication No. 04-076246 (1992), for example.

The background differential amplifying circuit 100 of Japanese Laid-Open Patent Publication No. 04-076246 (1992) has a gain of approximately 40 dB relative to the input voltages at a middle level in the power source voltage range. When this background amplifying circuit 100 is connected to the above output circuit, as discussed in Japanese Laid-Open Patent Publication No. 04-076246 (1992), the circuit as a whole may achieve a maximum gain of approximately 70 dB relative to the input voltages at a middle level in the power source voltage range, as illustrated in FIG. 7. Thus, the preferred embodiments can produce a gain greater than the gain of the background art by a maximum of approximately 30 dB, relative to the input voltages within the power source voltage range.

Figure 8:
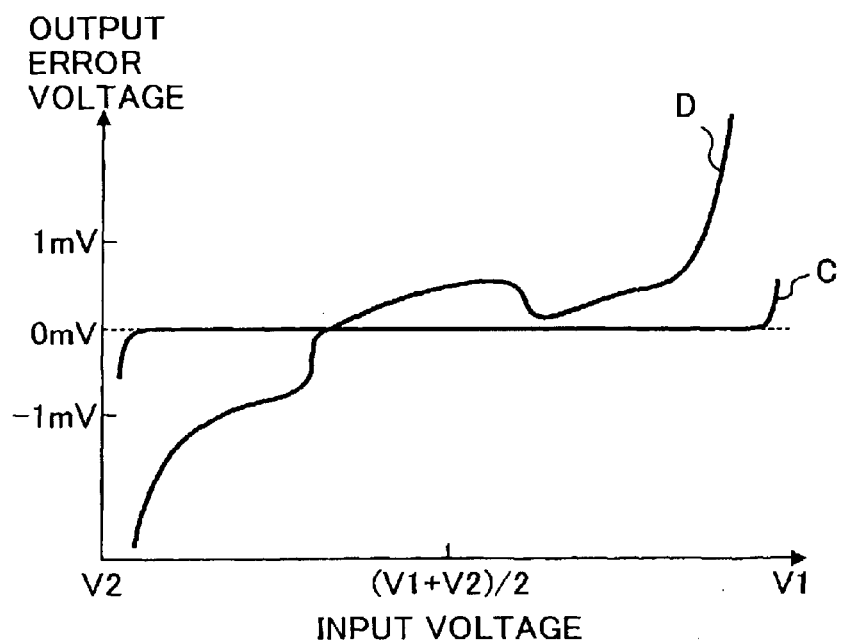
FIG. 8 is a graph for explaining an input and output characteristic of a voltage follower made of the differential amplifying circuit of FIG. 2 or 3 in comparison with the same characteristic of a voltage follower made of the background amplifying circuit of FIG. 2.

FIG. 8 illustrates a comparison of input and output performance by two cases of voltage follower circuits. A letter C indicates a case in which one of the differential amplifying circuits 1 and 1a is used and a letter D indicates a case of using the background differential amplifying circuit 100 of Japanese Laid-Open Patent Publication No. 04-076246 (1992). As shown in FIG. 8, the preferred embodiments can reduce an output error relative to input voltages within the power source range in comparison with the output error produced by the background art.

Electric characteristics of the differential amplifying circuit may vary depending on the sizes of the transistors used. FIGS. 7 and 8 illustrate typical performances of the differential amplifying circuits 1 and 1a and partly by the background differential amplifying circuit 100, in which sizes of the transistors used are comparable.

Figure 9:
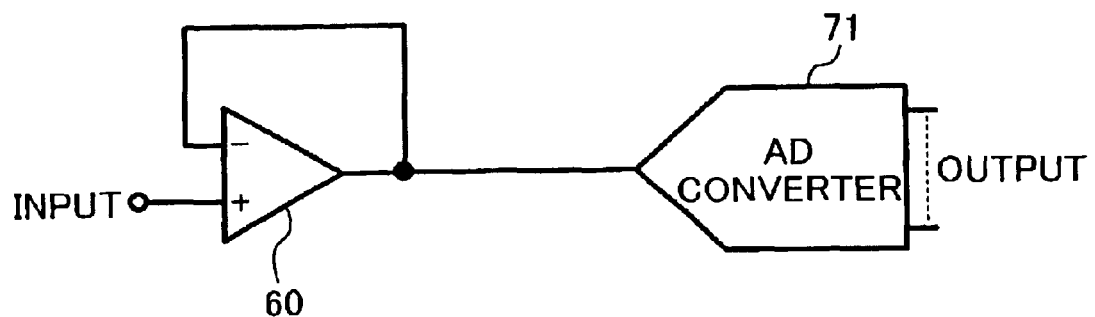
FIG. 9 is a schematic diagram of a voltage follower made of the operational amplifier of FIG. 5 or 6.

The differential amplifying circuit 1 can be used for various kinds of circuits other than for the operational amplifier. For example, it may be used for a sample-and-hold circuit with respect to an A/D (analog-to-digital) converter. FIG. 9 illustrates an exemplary voltage follower which uses the operational amplifier 60 to form a front stage for an A/D converter 71. In FIG. 9, an input signal to be subjected to an A/D conversion is processed through the operational amplifier 60 that forms a voltage follower and is input to the A/D converter 71 which performs the A/D conversion relative to the input signal.

If a voltage follower has a relatively small gain, the voltage follower generates a large output error relative to its input voltage. When such voltage follower having a relatively small gain is used as a front stage to an A/D converter, a relatively large output error generated by the voltage follower is added to an input signal input to the A/D converter. In addition, the amplitude of the output error generally varies in accordance with the amplitude of the input signal subjected to the A/D conversion. Therefore, with a voltage follower having a relatively small gain, a change in amplitude of the output error becomes large in accordance with the amplitude of the input signal to the A/D converter. This degrades the accuracy of the A/D converter represented by a sum of the output errors, generated by the A/D converter and the voltage follower, as a result.

In the case of FIG. 9, however, the operation amplifier 60 including the differential amplifying circuit 1 which has a relatively large gain reduces the output error in comparison to the above case. As a consequence, the output error included in the output signal output from the A/D converter 71 is reduced.

Figure 10:
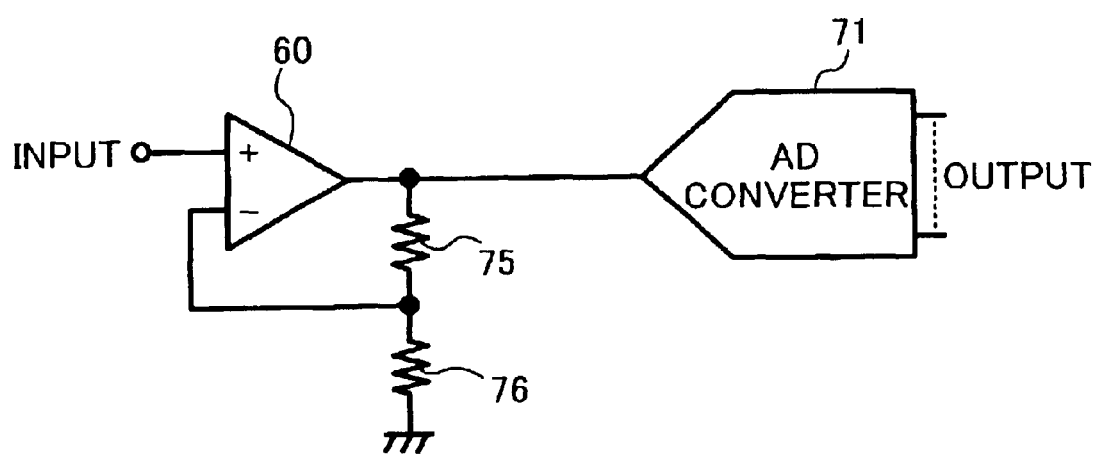
FIG. 10 is a schematic diagram of a non-inverse amplifier made of the operational amplifier of FIG. 5 or 6.

As an alternative structure to increase the A/D conversion performance, a non-inverse amplifier with a negative feedback may be used for the front stage to the A/D converter. In this case, a desired gain may be obtained by changing a ratio between resisters connected to the negative feedback. In FIG. 10, the operational amplifier 60 is arranged as a non-inverse amplifier with a negative feedback using resisters 75 and 76. This operational amplifier 60 can achieve a desired gain by changing a ratio between the resisters 75 and 76. Using the operational amplifier 60 arranged in this way increases the performance of the A/D conversion performed by the A/D converter 71. As such, the non-inverse amplifier can obtain a relatively large gain by using the operational amplifier 60. Consequently, the output error can be reduced relative to the A/D-converted signal and a change in output error due to the ratio between the resisters 75 and 76 can also be reduced.

In this way, the differential amplifying circuit 1 can operate relative to an input voltage in a wide power source voltage range with a relatively simple structure while achieving a relatively large gain.

Figure 11:
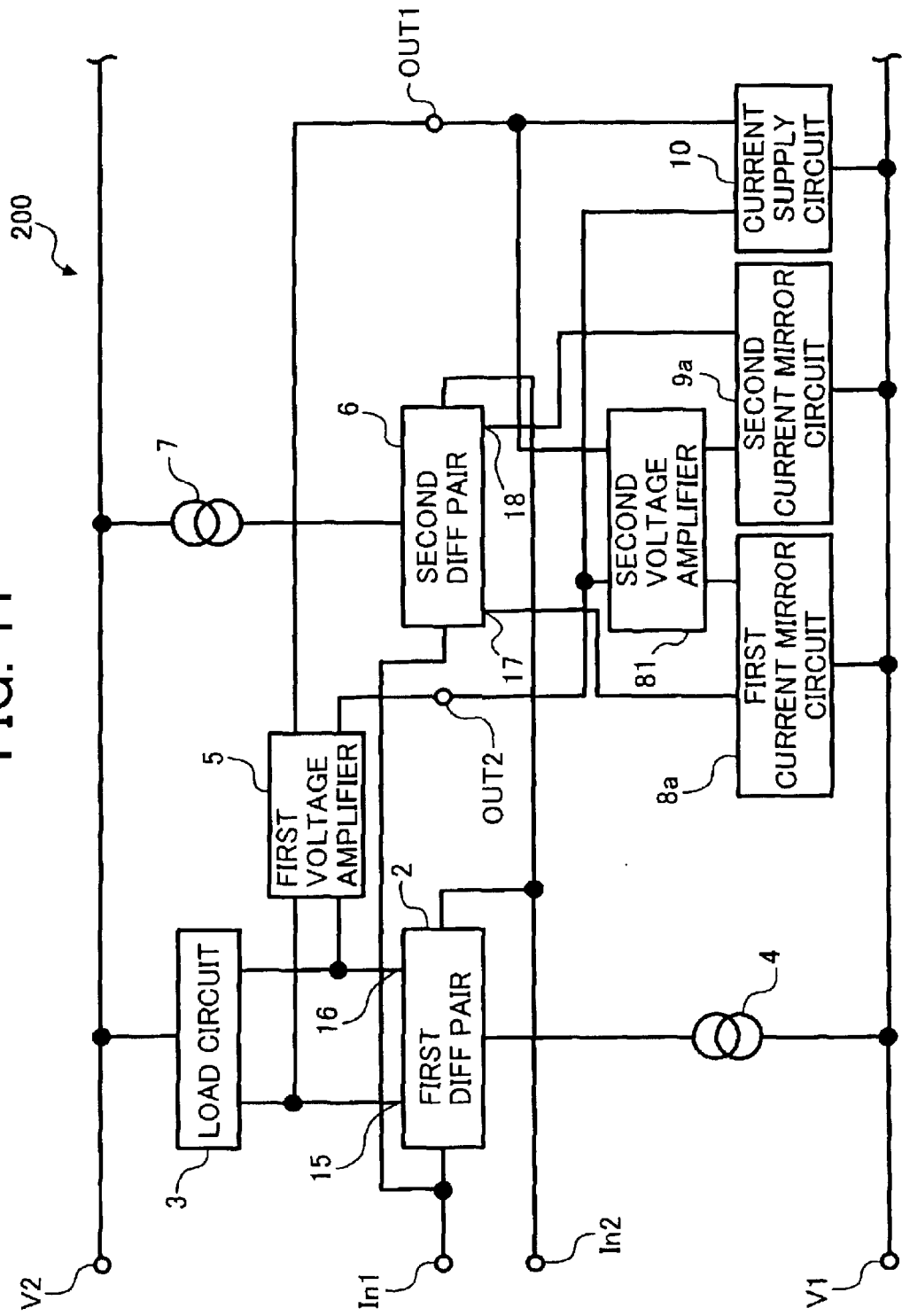
FIG. 11 is a schematic block diagram of a differential amplifying circuit according to another preferred embodiment.

Next, a differential amplifying circuit 200 according to another preferred exemplary embodiment is explained with reference to FIG. 11. FIG. 11 illustrates the differential amplifying circuit 200 which is similar to the differential amplifying circuit 1 of FIG. 4, except for first and second current mirror circuits 8a and 9a and a second voltage amplifier 81. The first and second current mirror circuits 8a and 9a replace the first and second current mirror circuits 8 and 9, respectively, each composed of two transistors. The second voltage amplifier 81 amplifies the outputs from the first and second current mirror circuits 8a and 9a.

In the differential amplifying circuit 200 of FIG. 11, the first current mirror circuit 8a is connected between the output terminal 17 of the second differential pair circuit 6 and the first power source terminal V1. The second current mirror circuit 9a is connected between the output terminal 18 of the second differential pair circuit 6 and the first power source terminal V1. The output terminal of the first current mirror circuit 8a is connected to the second output terminal OUT2 through the second voltage amplifier 81, and the output terminal of the second current mirror circuit 9a is connected to the first output terminal OUT1 through the second voltage amplifier 81.

Figure 12:
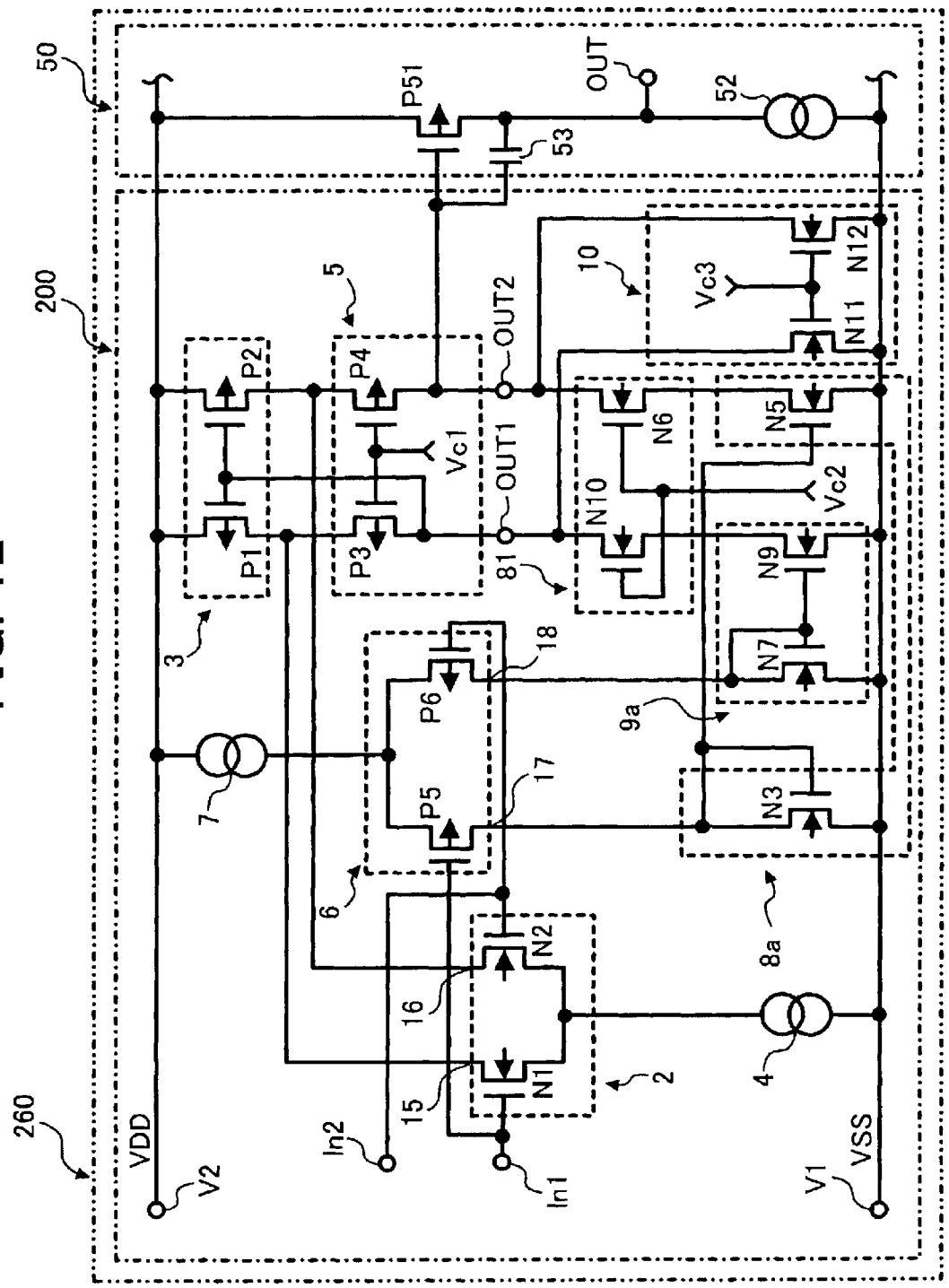
FIG. 12 is a detailed circuit diagram of an operational amplifier including the differential amplifying circuit of FIG. 11.

FIG. 12 illustrates an exemplary operational amplifier 260 that includes the output circuit 50 and the differential amplifying circuit 200 implementing CMOS (complementary metal oxide semiconductor) integrated circuits. In FIG. 12, the first power source terminal V1 is at a negative power source voltage VSS and the second power source terminal V2 is at a positive power source voltage VDD. Differences of the circuit of FIG. 12 from the circuit of FIG. 5 are eliminations of the NMOS transistors N4 and N8 and formations of the current mirror circuit 8a by the NMOS transistors N3 and N5, the current mirror circuit 9a by the NMOS transistors N7 and N9, and the second voltage amplifier 81 by the NMOS transistors N6 and N10. With such a structure, the differential amplifying circuit 200 of FIG. 12 can achieve substantially the same gain as the differential amplifying circuit 1 of FIG. 5.

Figure 13:
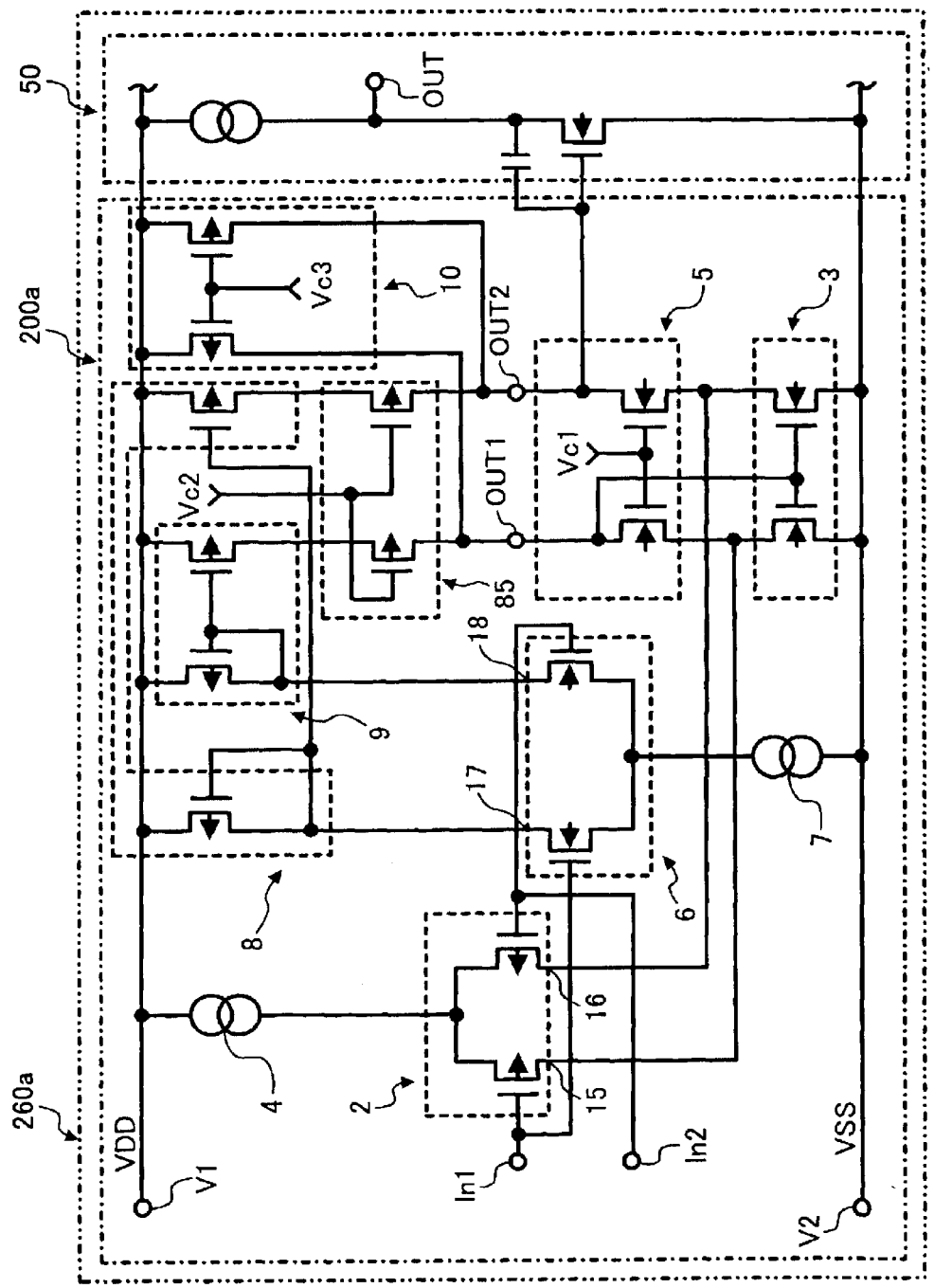
FIG. 13 is a detailed circuit diagram of a modified operational amplifier including a modified differential amplifying circuit based on the differential amplifying circuit of FIG. 12.

FIG. 13 illustrates a modified operational amplifier 260a that includes a modified differential amplifying circuit 200a and the output circuit 50. The modified differential amplifying circuit 200a is based on the differential amplifying circuit 200 of FIG. 12. In the modified differential amplifying circuit 200a, the first power source terminal V1 is at the positive power voltage VDD, instead of the negative power voltage VSS, the second power source terminal V2 is at the negative power voltage VSS, instead of the positive power voltage VDD, and the corresponding transistors are replaced with those having opposite polarities. The modified differential amplifying circuit 200a of FIG. 13 is also capable of producing high gain signals as the differential amplifying circuit 200 of FIG. 12.

Figure 14:
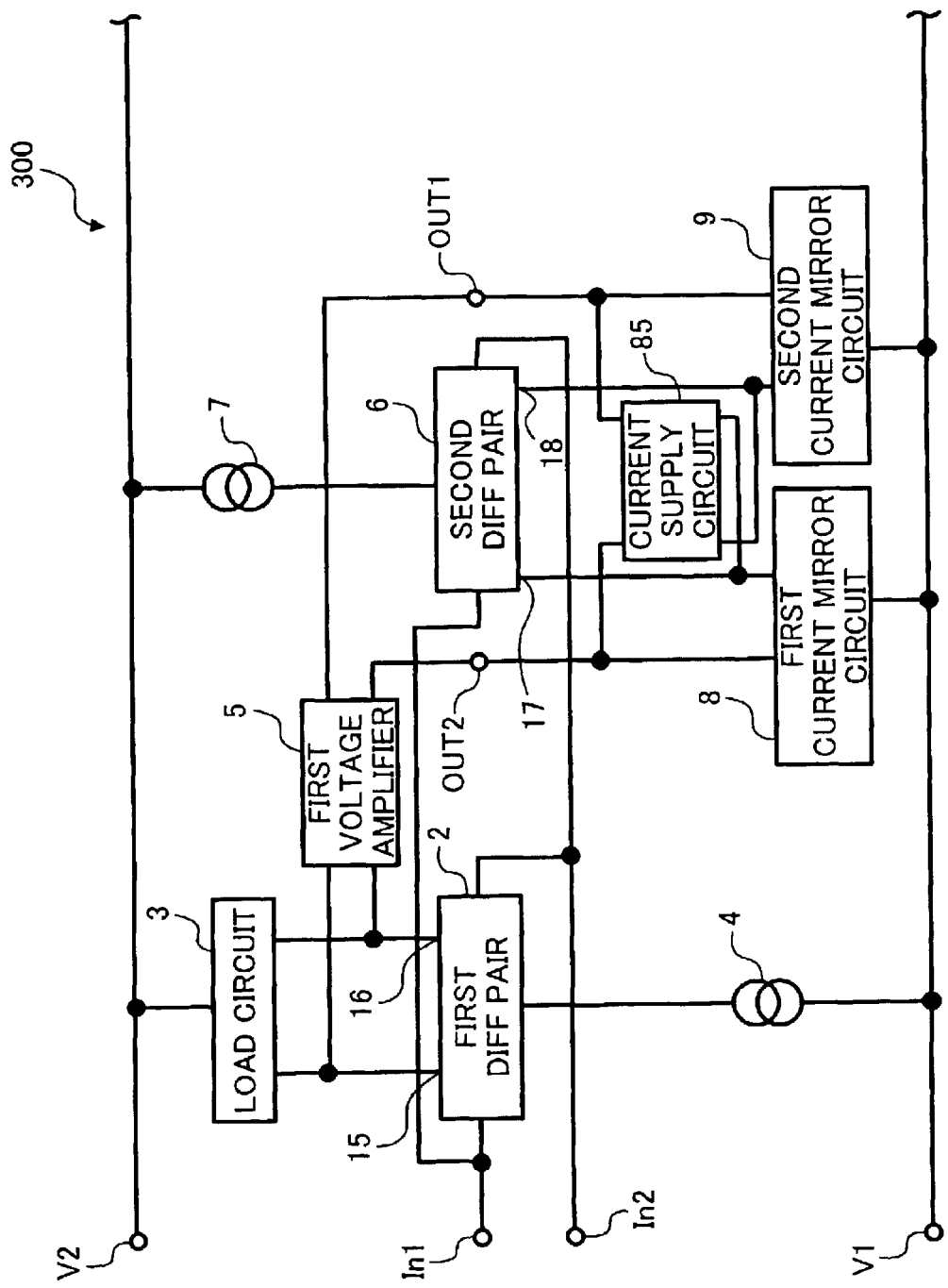
FIG. 14 is a schematic block diagram of a differential amplifying circuit according to another preferred embodiment.

Next, a differential amplifying circuit 300 according to another preferred exemplary embodiment is explained with reference to FIG. 14. FIG. 14 illustrates the differential amplifying circuit 300 which is similar to the differential amplifying circuit 1 of FIG. 4, except for a current supply circuit 85 in place of the current supply circuit 10. The current supply circuit 85 starts its operation when the voltages of the output terminals 17 and 18 of the second differential pair circuit 6 decreases below the respective predetermined voltages. More specifically, when input voltages close to the positive power source voltage V2 are input to the first and second input terminals In1 and In2, the second differential pair circuit 6 stops its operation and consequently reduces the output voltages from the output terminals 17 and 18. When the voltages of the output terminals 17 and 18 decrease below the respective predetermined voltages, the current supply circuit 85 starts allowing the currents output from the first voltage amplifier 5 to the first voltage source terminal V1 through the respective first and second current mirror circuits 8 and 9. In this way, the voltages in accordance with the output voltages from the output terminals 15 and 16 of the first differential pair circuit 2 can be output from the first and second output terminals OUT1 and OUT2 through the first voltage amplifier 5, when the second differential pair circuit 6 stops its operation.

Figure 15:
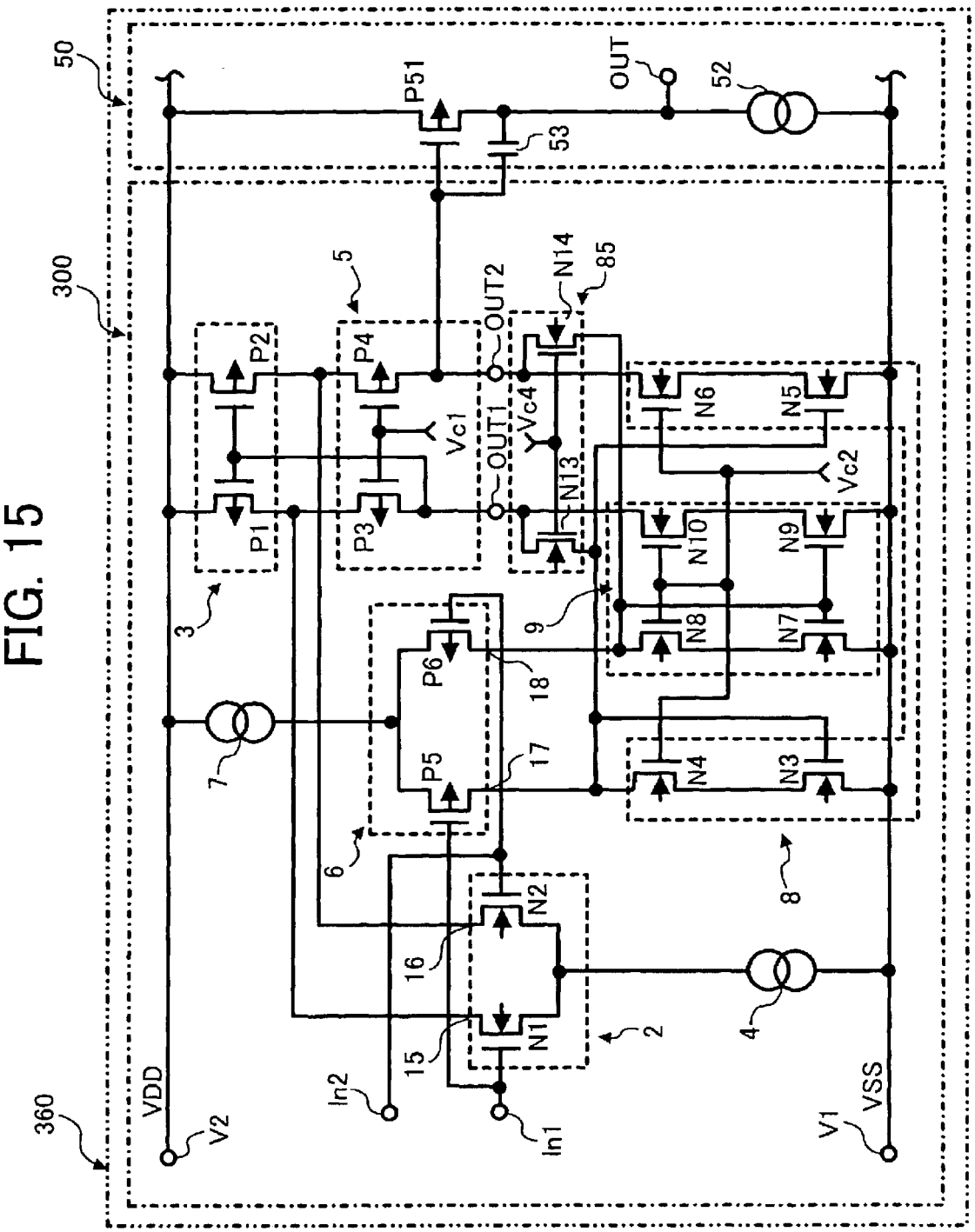
FIG. 15 is a detailed circuit diagram of an operational amplifier including the differential amplifying circuit of FIG. 14.

FIG. 15 illustrates an exemplary operational amplifier 360 that includes the output circuit 50 and the differential amplifying circuit 300 implemented in CMOS (complementary metal oxide semiconductor) integrated circuits. In FIG. 15, the first power source terminal V1 is at a negative power source voltage VSS and the second power source terminal V2 is at a positive power source voltage VDD. The current supply circuit 85 includes NMOS transistors N13 and N14. The NMOS transistor N13 is connected between the first output terminal OUT1 and the output terminal 17 of the second differential pair circuit 6, and the NMOS transistor N14 is connected between the second output terminal OUT2 and the output terminal 18 of the second differential pair circuit 6. Each of the NMOS transistors N13 and N14 has a gate connected to a predetermined voltage Vc4.

In this structure, drain current values of the NMOS transistors N13 and N14 are determined by the respective voltages at the output terminals 17 and 18 of the second differential pair circuit 6. The respective voltages at the output terminal 17 and 18 change in response to the input voltages to the first and second input terminals In1 and In2, and consequently the drain current of the NMOS transistors N13 and N14 change. For example, the voltage Vc4 is determined such that the NMOS transistors N13 and N14 turn on to allow the currents to flow through the transistors N4 and N8 when the respective input voltages to the first and second input terminals In1 and In2 come close to the positive power source voltage VDD and subsequently the second differential pair circuit 6 stops its operation.

When voltages close to the positive power source voltage VDD are input to the first and second input terminals In1 and In2, the first differential pair circuit 2 composed of the NMOS transistors normally operates. In this case, however, the second differential pair circuit 6 composed of the PMOS transistors may stop its operation, and the output terminals 17 and 18 may consequently output the respective voltages close to the negative power source voltage VSS. Since the first and second current mirror circuits 8 and 9 determine their output current values by the voltages at the output terminals 17 and 18, respectively, the currents may hardly flow with the voltages close to the negative power source voltage VSS at the output terminals 17 and 18. As a consequence, expected effects by the arrangements of the NMOS transistors N6 and N10 and the PMOS transistors P3 and P4 may not be produced. This may cause a failure in which the respective voltages output from the first and second output terminals 15 and 16 of the first differential pair circuit 2 are not transmitted to the first and second output terminals OUT1 and OUT2, respectively.

To avoid the above failure, the current supply circuit 85 provides alternative current passages. That is, the NMOS transistors N13 and N14 of the current supply circuit 85 form respective current passages in place of the first and second current mirror circuits 8 and 9. The NMOS transistors N13 and N14 allow the currents to flow through the PMOS transistors P3 and P4 of the first voltage amplifier 5. When the input voltages close to the positive power source voltage VDD are input to the respective input terminals In1 and In2, the second differential pair circuit 6 stops its operation and the output voltages at the output terminals 17 and 18 consequently reduce. Accordingly, the PMOS transistors P3 and P4 can operate by causing the currents flow through them even when the currents do not flow through the NMOS transistors N5 and N9. Thereby, high gain signals can be output from the first and second output terminals OUT1 and OUT2.

The NMOS transistors N13 and N14 of the current supply circuit 85 perform switching operations. The NMOS transistor N13 turns on when a difference between the predetermined voltage Vc4 and the voltage at the output terminal 17 of the second differential pair circuit 6 exceeds the threshold voltage of the NMOS transistor N13. Likewise, the NMOS transistor N14 turns on when a difference between the predetermined voltage Vc4 and the voltage at the output terminal 18 of the second differential pair circuit 6 exceeds the threshold voltage of the NMOS transistor N14.

When the NMOS transistor N13 turns on, the current output from the PMOS transistor P3 of the first voltage amplifier 5 flows through the first power source terminal V1 via the NMOS transistors N13, N4, and N3. Also, when the NMOS transistor N14 turns on, the current output from the PMOS transistor P4 of the first voltage amplifier 5 flows through the first power source terminal V1 via the NMOS transistors N14, N8, and N7. Thus, the PMOS transistors P3 and P4 allow the current flow and become operable.

On the other hand, with the input voltages are within the range at which the second differential pair circuit 6 is operable, the respective voltages at the output terminals 17 and 18 are reduced to the extent close to the negative power source voltage VSS and therefore the NMOS transistors N13 and N14 of the current supply circuit 85 turn off. Accordingly, the current output from the first voltage amplifier 5 flows through the first power source terminal V1 via the first and second current mirror circuits 8 and 9. Thus, the expected effects by the arrangements of the first voltage amplifier 5 and the NMOS transistors N6 and N10 are obtained.

Figure 16:
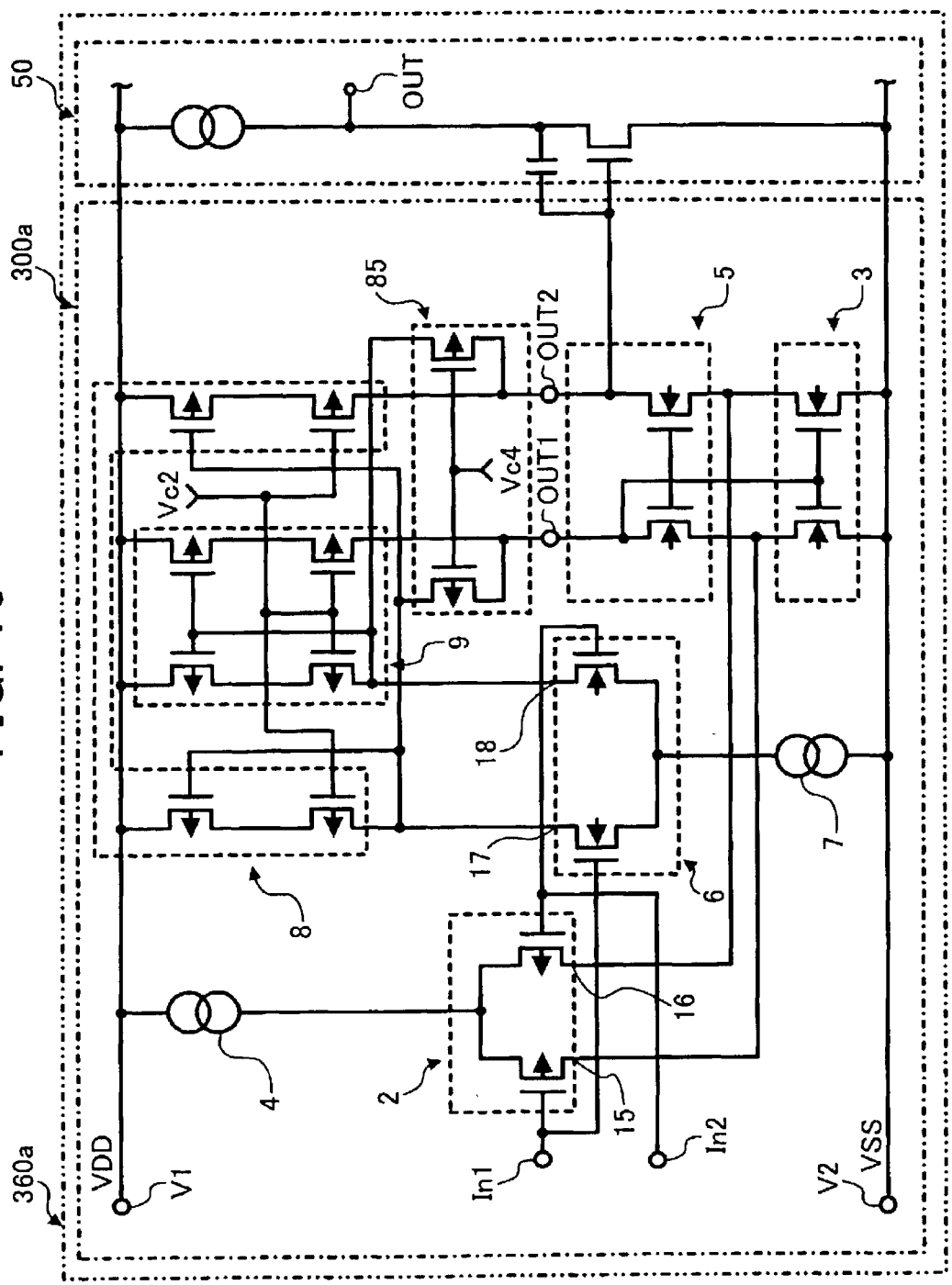
FIG. 16 is a detailed circuit diagram of a modified operational amplifier including a modified differential amplifying circuit based on the differential amplifying circuit of FIG. 15.

FIG. 16 illustrates a modified operational amplifier 360a that includes a modified differential amplifying circuit 300a and the output circuit 50. The modified differential amplifying circuit 300a is based on the differential amplifying circuit 300 of FIG. 15. In the modified differential amplifying circuit 300a, the first power source terminal V1 is at the positive power voltage VDD, instead of the negative power voltage VSS, the second power source terminal V2 is at the negative power voltage VSS, instead of the positive power voltage VDD, and the corresponding transistors are replaced with those having opposite polarities. The modified differential amplifying circuit 300a of FIG. 16 is also capable of producing high gain signals as the differential amplifying circuit 300 of FIG. 15.

In this way, the differential amplifying circuit 300 or 300a eliminates the current supply circuit 10 which always supplies the current to the first voltage amplifier 5 and instead uses the current supply circuit 85 which supplies the current to the first voltage amplifier 5 when the second differential pair circuit 6 stops its operation and the respective voltages at the output terminals 17 and 18 go below the predetermined voltages. Therefore, the differential amplifying circuit 300 can achieve substantially the same effects as the differential amplifying circuit 1 or 1a, while reducing the electric power consumption by supplying current to the first voltage amplifier 5 on an as needed basis.

Next, a differential amplifying circuit 400 according to another preferred exemplary embodiment is explained with reference to FIG. 17. The differential amplifying circuit 400 of FIG. 17 is similar to the differential amplifying circuit 300 of FIG. 14, except for an addition of a second voltage amplifier 81 of the differential amplifying circuit 200 of FIG. 11.

Figure 17:
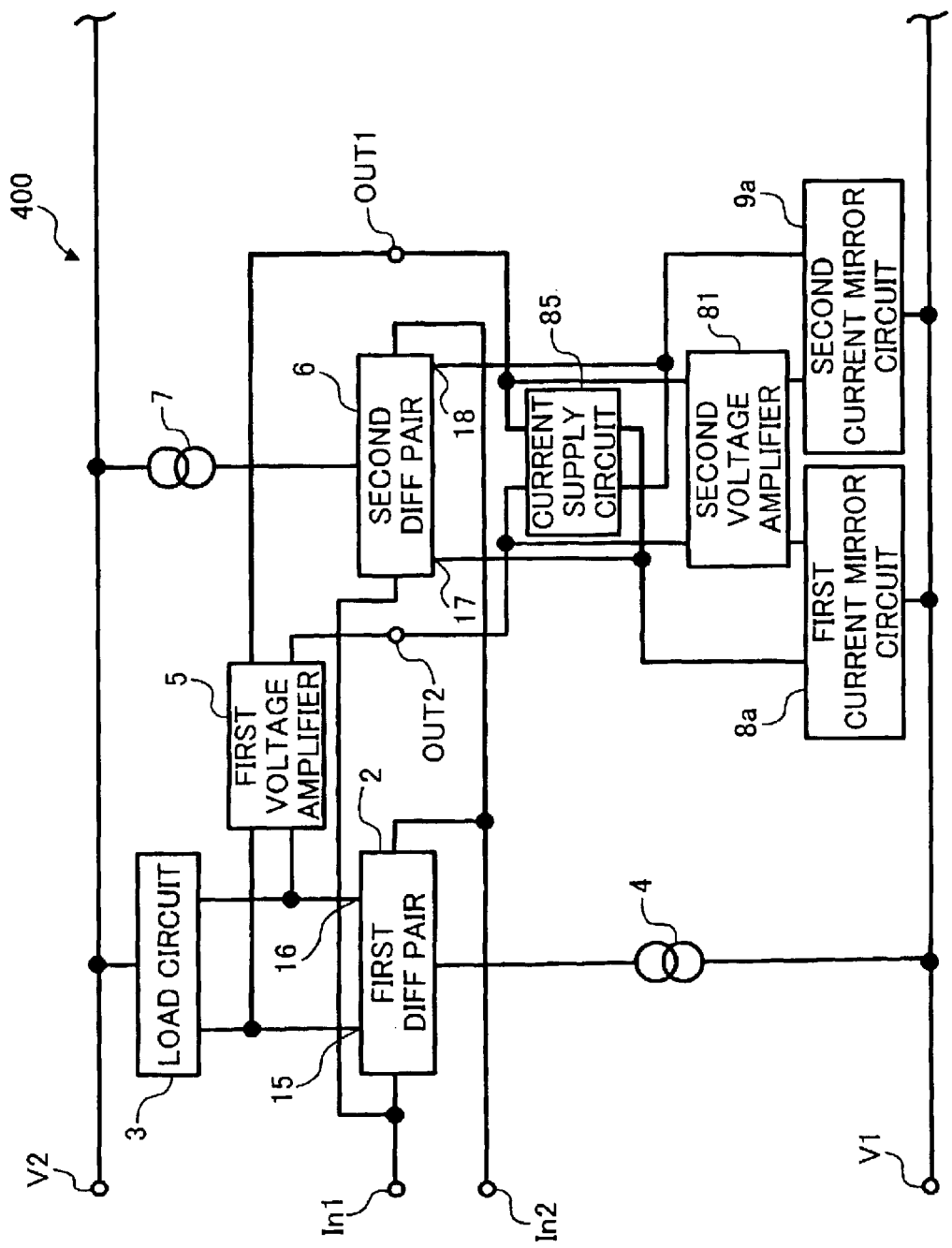
FIG. 17 is a schematic block diagram of a differential amplifying circuit according to another preferred embodiment.

In FIG. 17, the first current mirror circuit 8a is connected between the output terminal 17 of the second differential pair circuit 6 and the first power source terminal V1, and the second current mirror circuit 9a is connected between the output terminal 18 of the second differential pair circuit 6 and the first power source terminal V1. The first current mirror circuit 8a has an output terminal connected to the second output terminal OUT2 via the second voltage amplifier 81, and the second current mirror circuit 9a has an output terminal connected to the first output terminal OUT1 via the second voltage amplifier 81.

Figure 18:
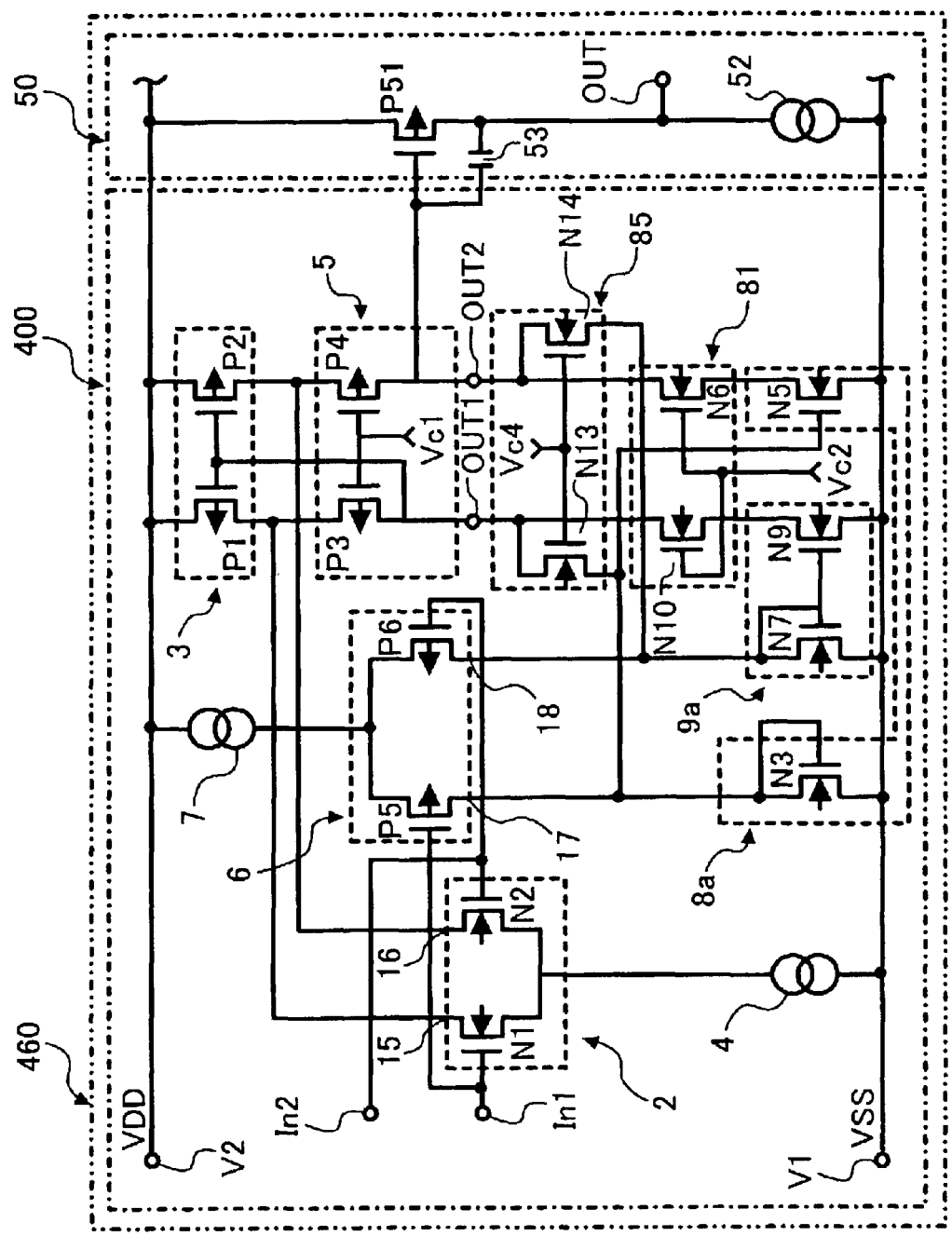
FIG. 18 is a detailed circuit diagram of an operational amplifier including the differential amplifying circuit of FIG. 17.

FIG. 18 shows an exemplary operational amplifier 460 that includes the output circuit 50 and the differential amplifying circuit 400 implemented in CMOS (complementary metal oxide semiconductor) integrated circuits. In FIG. 18, the first power source terminal V1 is at a negative power source voltage VSS and the second power source terminal V2 is at a positive power source voltage VDD. The differential amplifying circuit 400 of FIG. 18 is similar to the differential amplifying circuit 300 of FIG. 15, except for the following. The NMOS transistors N4 and N8 shown in FIG. 15 are eliminated. The first current mirror circuit 8a is formed by the NMOS transistors N3 and N5. The second current mirror circuit 9a is formed by the NMOS transistors N7 and N9. The second voltage amplifier 81 is formed by the NMOS transistors N6 and N10. With such a structure, the differential amplifying circuit 400 can produce substantially the same effects as the differential amplifying circuit 300.

Figure 19:
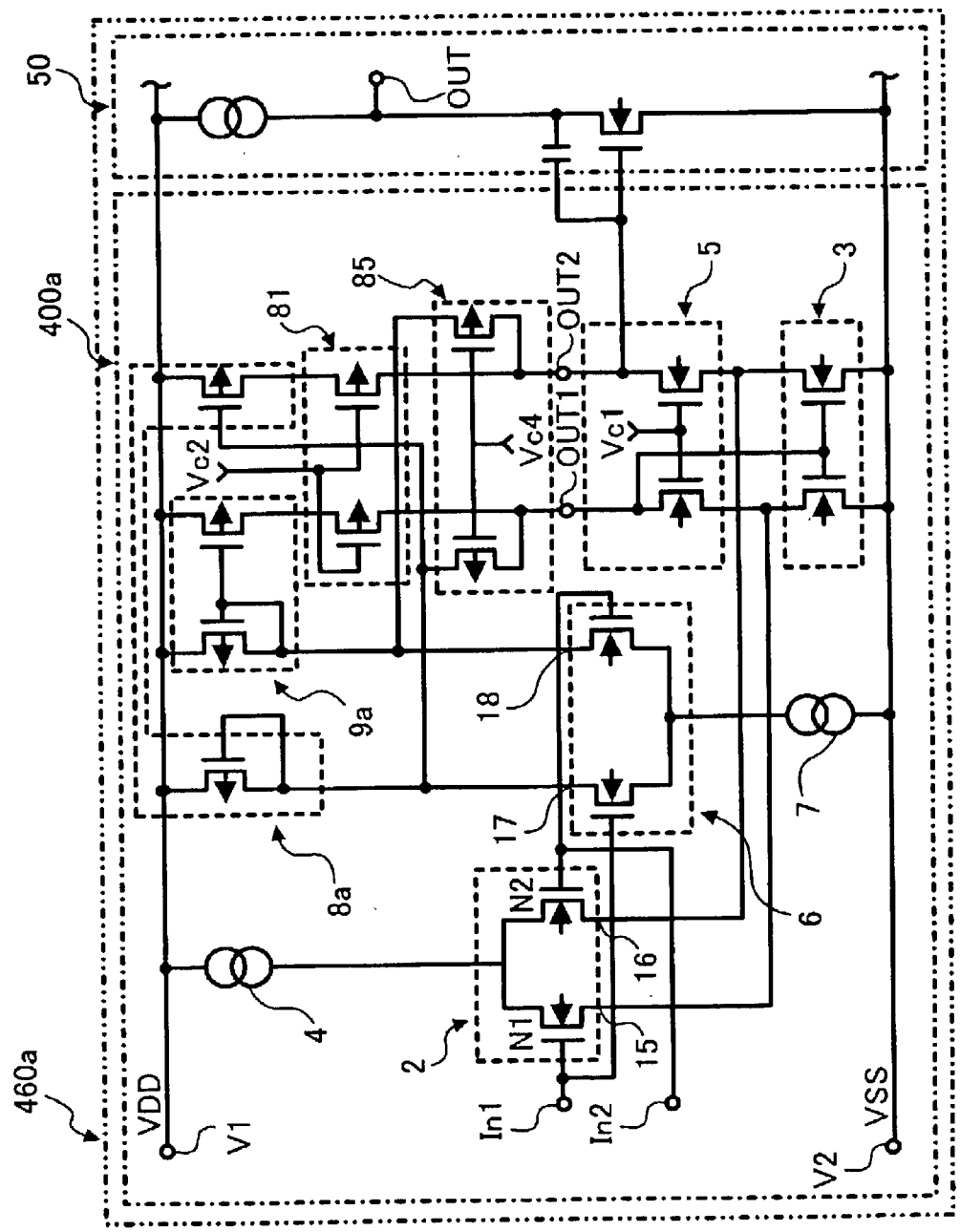
FIG. 19 is a detailed circuit diagram of a modified operational amplifier including a modified differential amplifying circuit based on the differential amplifying circuit of FIG. 18.

FIG. 19 illustrates a modified operational amplifier 460a that includes a modified differential amplifying circuit 400a and the output circuit 50. The modified differential amplifying circuit 400a is based on the differential amplifying circuit 400 of FIG. 18. In the modified differential amplifying circuit 300a, the first power source terminal V1 is at the positive power voltage VDD, instead of the negative power voltage VSS, the second power source terminal V2 is at the negative power voltage VSS, instead of the positive power voltage VDD, and the corresponding transistors are replaced with those having opposite polarities. The modified differential amplifying circuit 400a of FIG. 19 is also capable of producing high gain signals as the differential amplifying circuit 400 of FIG. 18.

The CMOS transistors used in the above-described differential amplifying circuits 1, 1a, 200, 200a, 300, 300a, 400, and 400a may be substituted with bipolar transistors, for example.

The output circuit 50 may be implemented inside the above-described differential amplifying circuits 1, 1a, 200, 200a, 300, 300a, 400, and 400a.

Numerous additional modifications and variations are possible in light of the above teachings. It is therefore to be understood that within the scope of the appended claims, the disclosure of this patent specification may be practiced otherwise than as specifically described herein.

This patent specification is based on Japanese patent application, No. 2001-287139 filed on Sep. 20, 2001, in the Japanese Patent Office, the entire contents of which are incorporated by reference herein.

What is claimed is:

1. A differential amplifying apparatus which has first and second input terminals for receiving input voltages and first and second output terminals for outputting output voltages, comprising:

a first differential pair circuit including a pair of transistors having corresponding control electrodes connected to the first and second input terminals;

a second differential pair circuit including a pair of transistors having corresponding control electrodes connected to the first and second input terminals, and possessing conductivity with a polarity opposite from the first differential pair circuit;

a first current source connected between the first differential pair circuit and a first power source terminal and configured to bias the first differential pair circuit;

a second current source connected between the second differential pair circuit and a second power source terminal and configured to bias the second differential pair circuit;

a load circuit connected between the first differential pair circuit and the second power source terminal and configured to load the first differential pair circuit;

a first current mirror circuit connected between a corresponding output terminal of the second differential pair circuit and the first power source terminal and having an output terminal connected to the second output terminal;

a second current mirror circuit connected between a corresponding output terminal of the second differential pair circuit and the first power source terminal and having an output terminal connected to the first output terminal; and a first voltage amplifying circuit configured to amplify voltages output from output terminals of the first differential pair circuit and to output amplified voltages to the first and second output terminals, wherein said amplified voltages output to the first and second output terminals have a desired gain relative to said input voltages.

2. A differential amplifying apparatus as defined in claim 1, wherein each of the first and second current mirror circuits includes a pair of transistors connected in a cascade connection.

3. A differential amplifying apparatus as defined in claim 1, wherein the first voltage amplifying circuit includes a pair of transistors having control electrodes to which a first predetermined constant voltage is applied, amplifying voltages output from corresponding output terminals of the first differential pair circuit, and outputting amplified voltages.

4. A differential amplifying apparatus as defined in claim 1, further comprising:

a second voltage amplifying circuit configured to amplify voltages output from the first and second current mirror circuits and to output amplified voltages to the corresponding first and second output terminals.

5. A differential amplifying apparatus as defined in claim 4, wherein the second voltage amplifying circuit includes a pair of transistors having control electrodes to which a second predetermined constant voltage is applied, amplifying voltages output from corresponding of the first and second current mirror circuits, and outputting amplified voltages.

6. A differential amplifying apparatus as defined in claim 1, further comprising:

a current supply circuit connected between the output terminals of the first voltage amplifying circuit and the first power source terminal and configured to bypass currents output from the respective output terminals of the first voltage amplifying circuit to the first power source terminal so as to supply currents to the first voltage amplifying circuit.

7. A differential amplifying apparatus as defined in claim 6, wherein the current supply circuit includes a pair of transistors having control electrodes to which a third predetermined constant voltage is applied and bypassing the corresponding currents output from of the first voltage amplifying circuit to the first power source terminal.

8. A differential amplifying apparatus as defined in claim 1, further comprising:

a current supply circuit having input terminals connected to corresponding of the output terminals of the first voltage amplifying circuit and output terminals connected to input terminals of corresponding of the first and second current mirror circuits and configured to supply currents to the first voltage amplifying circuit when the second differential pair circuit stops its operation by bypassing the currents output from the respective output terminals of the first voltage amplifying circuit to the first power source terminals via corresponding of the first and second current mirror circuits.

9. A differential amplifying apparatus as defined in claim 8, wherein the current supply circuit includes a pair of transistors having control electrodes to which a fourth predetermined constant voltage is applied, and connected between the output terminals of the first voltage amplifying circuit and the input terminals of corresponding of the first and second current mirror circuits.

10. A differential amplifying apparatus as defined in claim 9, wherein the fourth predetermined voltage is a voltage to turn on the transistors of the current supply circuit when the second differential pair circuit stops its operation.

11. A differential amplifying apparatus as defined in claim 1, further comprising an output circuit for amplifying the voltages output from the first and second output terminals.

12. A differential amplifying apparatus which has first and second input terminals for receiving input voltages and first and second output terminals for outputting output voltages, comprising:

first differential pair circuit means connected to the first and second input terminals;

second differential pair circuit means connected to the first and second input terminals, and possessing conductivity opposite from the first differential pair circuit means;

first current source means connected between the first differential pair circuit means and a first power source terminal, for biasing the first differential pair circuit means;

second current source means connected between the second differential pair circuit means and a second power source terminal, for biasing the second differential pair circuit means;

load circuit means connected between the first differential pair circuit means and the second power source terminal, for loading the first differential pair circuit means;

first current mirror circuit means connected between a corresponding output terminal of the second differential pair circuit means and the first power source terminal and having an output terminal connected to the second output terminal;

second current mirror circuit means connected between a corresponding output terminal of the second differential pair circuit means and the first power source terminal and having an output terminal connected to the first output terminal; and first voltage amplifying circuit means for amplifying voltages output from output terminals of the first differential pair circuit means and outputting amplified voltages to the first and second output terminals, wherein said amplified voltages output to the first and second output terminals have a desired gain relative to said input voltages.

13. A differential amplifying apparatus as defined in claim 12, wherein transistors included in each pair of the pairs of transistors of the first and second current mirror circuits are connected in a cascade connection.

14. A differential amplifying apparatus as defined in claim 12, wherein both the first and second differential pair circuit means include a pair of transistors, the pair of the first differential pair circuit means having conductivity with a polarity opposite from that of the pair of the second differential pair circuit means.

15. A differential amplifying apparatus as defined in claim 12, wherein the first voltage amplifying circuit means includes a pair of transistors having control electrodes to which a first predetermined constant voltage is applied, amplifying voltages output from corresponding output terminals of the first differential pair circuit means, and outputting amplified voltages.

16. A differential amplifying apparatus as defined in claim 12, further comprising:

second voltage amplifying circuit means for amplifying voltages output from the first and second current mirror circuit means and outputting amplified voltages to the corresponding first and second output terminals.

17. A differential amplifying apparatus as defined in claim 16, wherein the second voltage amplifying circuit means includes a pair of transistors having control electrodes to which a second predetermined constant voltage is applied, amplifying voltages output from corresponding of the first and second current mirror circuit means, and outputting amplified voltages.

18. A differential amplifying apparatus as defined in claim 12, further comprising:

current supply circuit means connected between the output terminals of the first voltage amplifying circuit means and the first power source terminal, for bypassing currents output from the respective output terminals of the first voltage amplifying circuit means to the first power source terminal so as to supply currents to the first voltage amplifying circuit means.

19. A differential amplifying apparatus as defined in claim 18, wherein the current supply circuit means includes a pair of transistors having control electrodes to which a third predetermined constant voltage is applied and bypassing the corresponding currents output from of the first voltage amplifying circuit means to the first power source terminal.

20. A differential amplifying apparatus as defined in claim 12, further comprising:

current supply circuit means, having input terminals connected to corresponding of the output terminals of the first voltage amplifying circuit means and output terminals connected to input terminals of corresponding of the first and second current mirror circuit means, for supplying currents to the first voltage amplifying circuit means when the second differential pair circuit means stops its operation by bypassing the currents output from the respective output terminals of the first voltage amplifying circuit means to the first power source terminals via corresponding of the first and second current mirror circuit means.

21. A differential amplifying apparatus as defined in claim 20, wherein the current supply circuit means includes a pair of transistors having control electrodes to which a fourth predetermined constant voltage is applied, and connected between the output terminals of the first voltage amplifying circuit means and the input terminals of corresponding of the first and second current mirror circuit means.

22. A differential amplifying apparatus as defined in claim 21, wherein the fourth predetermined voltage is a voltage to turn on the transistors of the current supply circuit means when the second differential pair circuit means stops its operation.

23. A differential amplifying apparatus as defined in claim 12, further comprising an output circuit means for amplifying the voltages output from the first and second output terminals.

24. A differential amplifying method of amplifying voltages input from first and second input terminals and outputting from first and second output terminals, comprising the steps of:

providing a first differential pair circuit including a pair of transistors having corresponding control electrodes;

connecting control electrodes of the pair of transistors to corresponding of the first and second input terminals;

providing a second differential pair circuit including a pair of transistors having conductivity with a polarity opposite from conductivity of the pair of transistors of the first differential pair circuit;

connecting control electrodes of the pair of transistors to corresponding of the first and second input terminals;

connecting a first current source between the first differential pair circuit and a. first power source terminal to bias the first differential pair circuit;

connecting a second current source between the second differential pair circuit and a second power source terminal to bias the second differential pair circuit;

connecting a load circuit between the first differential pair circuit and the second power source terminal to load the first differential pair circuit;

connecting a first current mirror circuit between a corresponding output terminal of the second differential pair circuit and the first power source terminal;

connecting an output terminal of the first current mirror circuit to the second output terminal;

connecting a second current mirror circuit between a corresponding output terminal of the second differential pair circuit and the first power source terminal;

connecting an output terminal of the second current mirror circuit to the first output terminal; and connecting a first voltage amplifying circuit between output terminals of the first differential pair circuit and corresponding of the first and second output terminals, the first voltage amplifying circuit amplifying the voltages output from the output terminals of the first differential pair circuit and outputting amplified voltages to the corresponding of the first and second output terminals, wherein said amplified voltages output to the first and second output terminals have a desired gain relative to said input voltages.

25. A method as defined in claim 24, wherein each of the first and second current mirror circuits includes transistors connected in a cascade connection.

26. A method as defined in claim 24, wherein the first voltage amplifying circuit includes a pair of transistors having control electrodes to which a first predetermined constant voltage is applied, amplifying voltages output from corresponding output terminals of the first differential pair circuit, and outputting amplified voltages.

27. A method as defined in claim 24, further comprising the step of:

connecting a second voltage amplifying circuit between the output terminals of the first and second current mirror circuits and the corresponding first and second output terminals, the second voltage amplifying circuit amplifying voltages output from the first and second current mirror circuits and outputting amplified voltages to the corresponding first and second output terminals.

28. A method as defined in claim 27, wherein the second voltage amplifying circuit includes a pair of transistors having control electrodes to which a second predetermined constant voltage is applied, amplifying voltages output from corresponding of the first and second current mirror circuits, and outputting amplified voltages.

29. A method as defined in claim 24, further comprising the step of:

connecting a current supply circuit between the output terminals of the first voltage amplifying circuit and the first power source terminal, the current supply circuit being configured to bypass currents output from the respective output terminals of the first voltage amplifying circuit to the first power source terminal so as to supply currents to the first voltage amplifying circuit.

30. A method as defined in claim 29, wherein the current supply circuit includes a pair of transistors having, control electrodes to which a third predetermined constant voltage is applied and bypassing the corresponding currents output from of the first voltage amplifying circuit to the first power source terminal.

31. A method as defined in claim 24, further comprising the steps of:

providing a current supply circuit;

connecting input terminals of the current supply circuit to corresponding of the output terminals of the first voltage amplifying circuit; and connecting output terminals of the current supply circuit to input terminals of corresponding of the first and second current mirror circuits, wherein the current supply circuit supplies currents to the first voltage amplifying circuit when the second differential pair circuit stops its operation by bypassing the currents output from the respective output terminals of the first voltage amplifying circuit to the first power source terminals via corresponding of the first and second current mirror circuits.

32. A method as defined in claim 31, wherein the current supply circuit includes a pair of transistors having control electrodes to which a fourth predetermined constant voltage is applied, and connected between the output terminals of the first voltage amplifying circuit and the input terminals of corresponding of the first and second current mirror circuits.

33. A method as defined in claim 32, wherein the fourth predetermined voltage is a voltage to turn on the transistors of the current supply circuit when the second differential pair circuit stops its operation.

34. A method as defined in claim 24, further comprising the step of:

providing an output circuit for amplifying the voltages output from the first and second output terminals.

35. A differential amplifying circuit that receives input voltages at first and second input terminals and provides output voltages at first and second output terminals, and has first and second power source terminals for supplying power source voltages, comprising:

first and second differential pair circuits each including a pair of transistors having corresponding control electrodes connected to the first and second input terminals, the transistors of the respective differential pair circuit being of opposite polarity, and each of the differential pair circuits having respective input and output terminals;

first and second current sources functionally connected, respectively, between the first differential pair circuit and the first power source terminal, and between the second differential pair circuit and the second power terminal, said current sources being configured to bias the first and differential pair circuits;

a load circuit functionally connected between the first differential pair circuit and the second power source terminal and configured to load the first differential pair circuit;

first and second current mirror circuits functionally connected between the second differential pair circuit and the first power source terminal, and having output terminals connected, respectively, to the second output terminal and the first output terminal; and a first voltage amplifying circuit functionally connected to the first differential pair circuit and configured to amplify voltages output therefrom and to output amplified voltages to the first and second output terminals, wherein said amplified voltages output, to the first and second output terminals have a desired gain relative to said input voltages.

36. A differential amplifying circuit as defined in claim 35, further comprising:

a second voltage amplifying circuit functionally connected to the first and second current mirror circuits to amplify voltages provided thereby, and to output corresponding amplified voltages to the first and second output terminals.

37. A differential amplifying circuit as defined in claim 35, further comprising:

a current supply circuit functionally connected between the first voltage amplifying circuit and the first power source terminal and configured to bypass current output from the first voltage amplifying circuit to the first power source terminal so as to supply current to the first voltage amplifying circuit.

38. A differential amplifying circuit as defined in claim 35, further comprising:

a current supply circuit functionally connected between the first and second output and output terminals and the first and second current mirror circuits and configured to supply current to the first voltage amplifying circuit when the second differential pair circuit stops or significantly reduces its operation by bypassing current output from the first voltage amplifying circuit to the first power source terminals via corresponding of the first and second current mirror circuits.

39. A differential amplifying circuit as defined in claim 35, further comprising an output circuit functionally connected to the first and second output terminals to amplify voltages provided thereby.

40. A differential amplifying method of receiving voltages at first and second input terminals and outputting amplified voltages at first and second output terminals, comprising the steps of:

providing first and second differential pair circuits each including a pair of transistor having corresponding control electrodes connected to the first and second input terminals, the transistors of the respective differential pair circuit being of opposite polarity, and each of the differential pair circuits having respective input and output terminals;

functionally connecting the first and second current sources, respectively, between the first differential pair circuit and the first power source terminal, and between the second differential pair circuit and the second power terminal, said current sources being configured to bias the first and differential pair circuits;

providing a load circuit functionally connected between the first differential pair circuit and the second power source terminal, said load circuit being configured to load the first differential pair circuit;

functionally connecting first and second current mirror circuits between the second differential pair circuit and the first power source terminal, said current mirror circuits having output terminals connected, respectively, to the second output terminal and the first output terminal; and providing a first voltage amplifying circuit functionally connected to the first differential pair circuit and configured to amplify voltages output therefrom and to output amplified voltages to the first and second output terminals, wherein said amplified voltages output to the first and second output terminals have a desired gain relative to said input voltages.

41. A method as in claim 40, further comprising:

providing a second voltage amplifying circuit functionally connected to the first and second current mirror circuits to amplify voltages provided thereby, and to output corresponding amplified voltages to the first and second output terminals.

42. A method as in claim 40, further comprising:

providing a current supply circuit functionally connected between the first voltage amplifying circuit and the first power source terminal and configured to bypass current output from the first voltage amplifying circuit to the first power source terminal so as to supply current to the first voltage amplifying circuit.

43. A method as in claim 40, further comprising:

providing a current supply circuit functionally connected between the first and second output and output terminals and the first and second current mirror circuits and configured to supply current to the first voltage amplifying circuit when the second differential pair circuit stops or significantly reduces its operation by bypassing current output from the first voltage amplifying circuit to the first power source terminals via corresponding of the first and second current mirror circuits.

44. A method as in claim 40, further comprising providing an output circuit functionally connected to the first and second output terminals to amplify voltages provided thereby.

* * * * *